(12) United States Patent
Iversen et al.

(10) Patent No.: US 9,209,784 B2
(45) Date of Patent: Dec. 8, 2015

(54) SWITCHABLE CAPACITIVE ELEMENTS FOR PROGRAMMABLE CAPACITOR ARRAYS

(71) Applicant: RF Micro Devices, Inc., Greensboro, NC (US)

(72) Inventors: Christian Rye Iversen, Vestbjerg (DK); Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/922,337

(22) Filed: Jun. 20, 2013

(65) Prior Publication Data

US 2013/0278317 A1    Oct. 24, 2013

Related U.S. Application Data

(63) Continuation-in-part of application No. 13/095,357, filed on Apr. 27, 2011, now Pat. No. 8,970,278.

(60) Provisional application No. 61/693,114, filed on Aug. 24, 2012, provisional application No. 61/328,384, filed on Apr. 27, 2010.

(51) Int. Cl.
| | |
|---|---|
| *H03L 5/00* | (2006.01) |
| *H01P 1/22* | (2006.01) |
| *H03H 21/00* | (2006.01) |
| *H03K 17/10* | (2006.01) |

(52) U.S. Cl.
CPC ......... *H03H 21/0007* (2013.01); *H03K 17/102* (2013.01)

(58) Field of Classification Search
CPC ........................................................ H03L 5/00
USPC .............. 327/308, 365, 427, 306; 455/78–80; 333/81 R
See application file for complete search history.

(56) References Cited

U.S. PATENT DOCUMENTS

| | | | |
|---|---|---|---|
| 4,890,077 | A | 12/1989 | Sun |
| 5,617,055 | A | 4/1997 | Confalonieri et al. |
| 6,803,680 | B2 | 10/2004 | Brindle et al. |

(Continued)

OTHER PUBLICATIONS

Kelly, D. et al., "The state-of-the-art of silicon-on-sapphire CMOS RF Switches", 2005 IEEE Compound Semiconductor Integrated Circuity Symposium, Oct. 30-Nov. 2, 2005, pp. 200-203.

(Continued)

*Primary Examiner* — Dinh Le
(74) *Attorney, Agent, or Firm* — Withrow & Terranova, P.L.L.C.

(57) ABSTRACT

Switchable capacitive elements are disclosed, along with programmable capacitor arrays (PCAs). One embodiment of the switchable capacitive element includes a field effect transistor (FET) device stack, a first capacitor, and a second capacitor. The FET device stack is operable in an open state and in a closed state and has a plurality of FET devices coupled in series to form the FET device stack. The first capacitor and the second capacitor are both coupled in series with the FET device stack. However, the first capacitor is coupled to a first end of the FET device stack while the second capacitor is coupled to a second end opposite the first end of the FET device stack. In this manner, the switchable capacitive element can be operated without a negative charge pump, with decreased bias swings, and with a better power performance.

20 Claims, 8 Drawing Sheets

(56) References Cited

U.S. PATENT DOCUMENTS

| | | | |
|---|---|---|---|
| 7,026,858 B2 | 4/2006 | Tosaka | |
| 7,106,121 B2 | 9/2006 | Hidaka et al. | |
| 7,250,804 B2 | 7/2007 | Brindle | |
| 7,268,613 B2 | 9/2007 | Cranford, Jr. et al. | |
| 7,679,417 B2 | 3/2010 | Vice | |
| 7,843,280 B2 | 11/2010 | Ahn et al. | |
| 7,848,712 B2 | 12/2010 | Fu et al. | |
| 8,044,739 B2 * | 10/2011 | Rangarajan et al. | 331/167 |
| 8,058,922 B2 | 11/2011 | Cassia | |
| 8,093,940 B2 | 1/2012 | Huang et al. | |
| 8,330,519 B2 * | 12/2012 | Lam et al. | 327/308 |
| 2001/0040479 A1 | 11/2001 | Zhang | |
| 2007/0139094 A1 | 6/2007 | Nakatsuka et al. | |
| 2010/0214009 A1 | 8/2010 | Fechner | |

OTHER PUBLICATIONS

Shifrin, M.B. et al., "Monolithic FET structures for high-power control component applications", IEEE Transactions on Microwave Theory and Techniques, Dec. 1989, pp. 2134-2141, vol. 37, No. 12.

Sonnerat, F. et al., "4G Antenna Tuner Integrated in a 130 nm CMOS SOI Technology", 2012 IEEE 12th Topical Meeting on Silicon Monolithic Integrated Circuits in RF Systems (SiRF), Jan. 16-18, 2012, pp. 191-194.

Tinella, C. et al., "0.13/spl mu/m CMOS SOI SP6T antenna switch for multi-standard handsets", 2006 Topical Meeting on Silicon Monolithic Integrated Circuits in RF Systems, Jan. 18-20, 2006, pp. 58-61.

Non-Final Office Action for U.S. Appl. No. 13/095,302, mailed Oct. 19, 2012, 14 pages.

Final Office Action for U.S. Appl. No. 13/095,302, mailed Feb. 19, 2013, 14 pages.

Non-Final Office Action for U.S. Appl. No. 13/095,302, mailed Jun. 5, 2013, 13 pages.

Non-Final Office Action for U.S. Appl. No. 13/095,357, mailed Aug. 6, 2012, 8 pages.

Final Office Action for U.S. Appl. No. 13/095,357, mailed Jan. 2, 2013, 8 pages.

Advisory Action for U.S. Appl. No. 13/095,357, mailed Mar. 8, 2013, 3 pages.

Notice of Allowance for U.S. Appl. No. 13/095,357, mailed Apr. 5, 2013, 7 pages.

Non-Final Office Action for U.S. Appl. No. 13/095,410, mailed Nov. 8, 2012, 13 pages.

Final Office Action for U.S. Appl. No. 13/095,410, mailed Feb. 14, 2013, 15 pages.

Advisory Action for U.S. Appl. No. 13/095,410, mailed Jun. 19, 2013, 3 pages.

Supplemental Notice of Allowance for U.S. Appl. No. 13/095,357, mailed Jun. 21, 2013, 4 pages.

Non-Final Office Action for U.S. Appl. No. 13/095,357, mailed Aug. 7, 2013, 7 pages.

Final Office Action for U.S. Appl. No. 13/095,302, mailed Nov. 19, 2013, 14 pages.

Final Office Action for U.S. Appl. No. 13/095,357, mailed Jan. 7, 2014, 9 pages.

Non-Final Office Action for U.S. Appl. No. 13/095,410, mailed Feb. 3, 2014, 15 pages.

Advisory Action for U.S. Appl. No. 13/095,302, mailed Feb. 27, 2014, 3 pages.

Advisory Action for U.S. Appl. No. 13/095,357, mailed Mar. 20, 2014, 2 pages.

Final Office Action for U.S. Appl. No. 13/095,410, mailed May 27, 2014, 15 pages.

Non-Final Office Action for U.S. Appl. No. 13/095,410, mailed Apr. 28, 2015, 15 pages.

Examiner's Answer for U.S. Appl. No. 13/095,302, mailed Oct. 15, 2014, 8 pages.

Notice of Allowance for U.S. Appl. No. 13/095,357, mailed Oct. 23, 2014, 7 pages.

Advisory Action for U.S. Appl. No. 13/095,410, mailed Sep. 25, 2014, 3 pages.

* cited by examiner

SWITCHABLE CAPACITIVE ELEMENTS FOR PROGRAMMABLE CAPACITOR ARRAYS

RELATED APPLICATION

This application claims the benefit of U.S. Provisional Patent Application Ser. No. 61/693,114, filed on Aug. 24, 2012, the disclosure of which is hereby incorporated herein by reference in its entirety.

This application is a continuation-in-part of U.S. patent application Ser. No. 13/095,357, filed on Apr. 27, 2011, and entitled "HIGH POWER FET SWITCH," which claims the benefit of and priority to U.S. Provisional Patent Application Ser. No. 61/328,384, filed on Apr. 27, 2010 and entitled "SINGLE SUPPLY GROUND, AC COUPLED STACKED HIGH POWER FET SWITCH, SINGLE SUPPLY AC COUPLED STACKED HIGH POWER FET SWITCH, AND SINGLE SUPPLY STACKED HIGH POWER FET SWITCH," the disclosures of which are hereby incorporated herein by reference in their entireties.

FIELD OF THE DISCLOSURE

This disclosure relates to switchable capacitive elements and programmable capacitor arrays. More particularly, the disclosure relates to switchable capacitive elements and methods of operating the same.

BACKGROUND

FIG. 1 illustrates a related art switchable capacitive element 10 connected to a radio frequency (RF) line 12. The switchable capacitive element 10 has a field effect transistor (FET) device stack 14 and a capacitor $C_{RLW}$. The FET device stack 14 has a plurality of FET devices 16 coupled in series. Each of the plurality of FET devices 16 includes a drain contact D, a source contact S, a gate contact G, and a body contact B. The capacitor $C_{RLW}$ has a capacitance and is also coupled in series with the FET device stack 14. When the FET device stack 14 operates in a closed state, the switchable capacitive element 10 presents the capacitance of the capacitor $C_{RLW}$ to the RF line 12. With regard to an RF signal 18 propagating on the RF line 12, the switchable capacitive element 10 provides a shunt path for the RF signal 18 to ground.

However, when the FET device stack 14 operates in the open state, the switchable capacitive element 10 does not present the capacitance of the capacitor $C_{RLW}$ to the RF line 12. Instead, the switchable capacitive element 10 presents a minimum capacitance, which ideally is at zero but in practice may be the result of parasitic capacitances within the switchable capacitive element 10. The FET device stack 14 ideally operates as an open circuit and thus, theoretically, the FET device stack 14 does not conduct any of the RF signal 18. Of course, in practice, the FET device stack 14 may not operate precisely as an open circuit, but rather may simply present a very high impedance. Accordingly, some leakage currents are conducted through the FET device stack 14 during the open state, but these are generally low enough to be considered negligible. By stacking the plurality of FET devices 16, a voltage of the RF signal 18 can be distributed across the plurality of FET devices 16 when the FET device stack 14 is in the open state. This allows the FET device stack 14 to handle higher voltage RF signals 18.

Next, to provide the appropriate biasing voltages for operating the FET device stack 14, the switchable capacitive element 10 includes a related art control circuit 20 having a DC voltage source 22, a negative voltage source 24, a plurality of switches 26A, 26B, 26C, 26D, and 26E (referred to collectively as switches 26), and a bias control device 28 that controls the switches 26. The bias control device 28 controls the plurality of switches 26 to bias a gate voltage at the gate contacts G and a body voltage at the body contacts B in accordance with Table I below.

TABLE I

| Switch State | Gate Voltage | Body Voltage |
| --- | --- | --- |
| Open State | $-V_{bias}$ | $-V_{bias}$ |
| Transition State 1 | Ground | $-V_{bias}$ |
| Transition State 2 | Ground | Ground |
| Closed State | $+V_{bias}$ | Ground |

Each of the drain contacts D and the source contacts S of the plurality of FET devices 16 is biased at ground, or possibly at a different reference voltage, during both the open state and the closed state. The voltage at the drain contacts D and the source contacts S does not change with respect to the reference voltage (i.e., in this example, ground). However, by biasing the gate contacts G at the voltage $-V_{bias}$, the channels of the FET devices 16 are pinched off and a buffer voltage is provided that ensures that the RF signal 18 does not turn on the plurality of FET devices 16 during the open state. To prevent reverse bias diodes from being formed between the body of each of the plurality of FET devices 16 and the drain contacts D and the source contacts S of each of the plurality of FET devices 16, the body contacts B are also biased at the voltage $-V_{bias}$.

One of the problems with this approach is that it requires the negative voltage source 24 to maintain the gate contacts G at the negative bias voltage $-V_{bias}$ relative to ground during the open state. The negative voltage source 24 may be implemented using negative charge pumps that add additional complexity to the control circuit 20 and may generate spurs. Furthermore, the additional DC voltage source 22 is required to provide a positive bias $+V_{bias}$ to the gate contacts G, and to operate the FET device stack 14 in a closed state, which also adds complexity to the control circuit 20. If the negative voltage source 24 is implemented by the negative charge pumps, the finite output impedance of the negative charge pumps also causes problems during transitions from different states as connections to the gates and body are charged and discharged.

Another problem with the related art design is that it requires a bias swing of $|2V_{bias}|$ to turn the FET device stack 14 from the open state to the closed state, and vice versa. During steady state operation, the bias voltage $-V_{bias}$ has been selected so that voltage from the time-variant RF signal 18 does not cause the voltage at the gate contacts G to exceed the breakdown voltage, given the maximum and minimum voltage peaks of the time-variant RF signal 18. However, transition states are required so that the voltage between the gate contact G and the other drain and source contacts D, S of the FET devices 16 do not exceed the voltage handling capabilities of the FET devices 16 from the open and closed states. Of course, this adds additional complexity to the control circuit 20, as switches 26A-26E and/or logic level shifters are required to provide the appropriate gate and body voltages during each of these states. These switches 26A-26E of the bias control device 28 must be appropriately timed to avoid stressing the FET devices 16 during these transitions.

In addition, another disadvantage of the related art design is that the body contacts B must also be negatively biased if the plurality of FET devices 16 comprises the type of FET devices 16 that require body biasing. For example, in certain types of FET devices 16, internal reverse bias diodes that prevent the FET device stack 14 from operating appropriately are activated between the body contact B and the drain and source contracts D, S during the open state. If the internal reverse bias diodes are activated and a bias voltage $-V_{bias}$ is not provided at the body contacts B during the open state, then the voltage drop from the drain contact D to the source contacts S of each of the plurality of FET devices 16 would be limited to the voltage of a reverse bias diode, around 0.6 volts. Thus, the related art design requires negatively biasing the body contacts B to $-V_{bias}$ so that the reverse biased diodes are not reverse biased (or at least are not significantly reverse biased) during the open state. Also, the body contacts B must be transitioned back to ground when the FET device stack 14 operates in the closed state. This requires the control circuit 20 to have switches 26C, 26D and for the bias control device 28 to time these switches 26C, 26D appropriately. Other related art embodiments use floating body designs and may not include body contacts B or use self-biasing. However, related art floating body designs suffer from poor linearity.

Lossiness in the switchable capacitive element 10 also degrades the performance of the switchable capacitive element 10. One performance metric that is indicative of the lossiness of the switchable capacitive element 10 is a quality factor (Q factor) of the switchable capacitive element 10. The Q factor is a ratio of imaginary impedance to real impedance. With regard to the switchable capacitive element 10, the Q factor is an imaginary impedance of the switchable capacitive element 10 and a real impedance of the switchable capacitive element 10 when the FET device stack 14 is in the closed state. Since the imaginary impedance of the switchable capacitive element 10 is a function of frequency and the capacitance of the capacitor $C_{RLW}$, the Q factor of the switchable capacitive element 10 is also a function of frequency. Unfortunately, the switchable capacitive element 10 can be excessively lossy, which results in lower-than-desired Q factors at RF frequencies.

Accordingly, there is a need to develop a switchable capacitive element with higher Q factors and/or with control circuits that do not require excessive bias swings and negative biasing voltages.

SUMMARY

Embodiments in the detailed description describe a switchable capacitive element, along with embodiments of a programmable capacitor array (PCA) that includes more than one switchable capacitive element so as to be able to provide a variable capacitance. In one embodiment of the switchable capacitive element, the switchable capacitive element includes a field effect transistor (FET) device stack, a first capacitor, and a second capacitor. The FET device stack is operable in an open state and in a closed state, and comprises a plurality of FET devices coupled in series to form the FET device stack. The first capacitor and the second capacitor are both coupled in series with the FET device stack. However, the first capacitor is coupled to a first end of the FET device stack while the second capacitor is coupled to a second end of the FET device stack that is opposite the first end. The first capacitor and the second capacitor allow for the FET device stack to be provided in the open state and the closed state without a negative voltage from a negative charge pump. This topology can also reduce a bias swing in half. Finally, the second capacitor may be provided so as to see a very small RF voltage drop in the off state. This thereby can provide the switchable capacitive element with an increased quality factor (Q factor) and better power performance.

Each FET device includes a gate contact, a drain contact, and a source contact. A control circuit provides biasing voltages to the gate, source, and drain contacts of each of the plurality of FET devices to switch the FET device stack to and from a closed state and an open state. During the closed state, the control circuit biases the gate contacts of each of the plurality of FET devices at a first voltage $+V_{bias}$ relative to a reference voltage, such as ground, so that the FET device stack operates in the closed state. Also, during the closed state, the drain contacts and the source contacts of each of the FET devices may be biased to a second voltage relative to the reference voltage. The second voltage is less than the first voltage $+V_{bias}$, but is non-negative relative to the reference voltage, and in some embodiments may be the same as the reference voltage.

In the open state, the gate contacts of each of the plurality of FET devices are biased by the control circuit at the second voltage. To provide a buffer which prevents the plurality of FET devices from being turned on during the open state, the control circuit biases the drain contacts and the source contacts of each of the plurality of FET devices at the first voltage, which again is positive relative to the reference voltage. However, since the gate contacts have been biased to the second voltage, the gate contact of each of the plurality of FET devices appears negatively biased relative to the source and drain contacts. Accordingly, this provides a voltage buffer that prevents the FET devices from being turned on without actually having to provide a negative bias to the gate contacts relative to the reference voltage. Furthermore, the bias swing is the first voltage minus the second voltage from the open state to the closed state and vice versa at the gate contacts. If the magnitude of the first voltage is $|V_{bias}|$ and the second voltage is ground, then the bias swing provided by the control circuit is only $|V_{bias}|$.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The described devices, systems, and methods include topologies that reduce biasing swings caused when a stacked field effect transistor (FET) switch transitions from an open state to a closed state and vice versa. Furthermore, no negative charge pumps are required to provide a buffer voltage to the FET devices during the open state.

Figure 1:
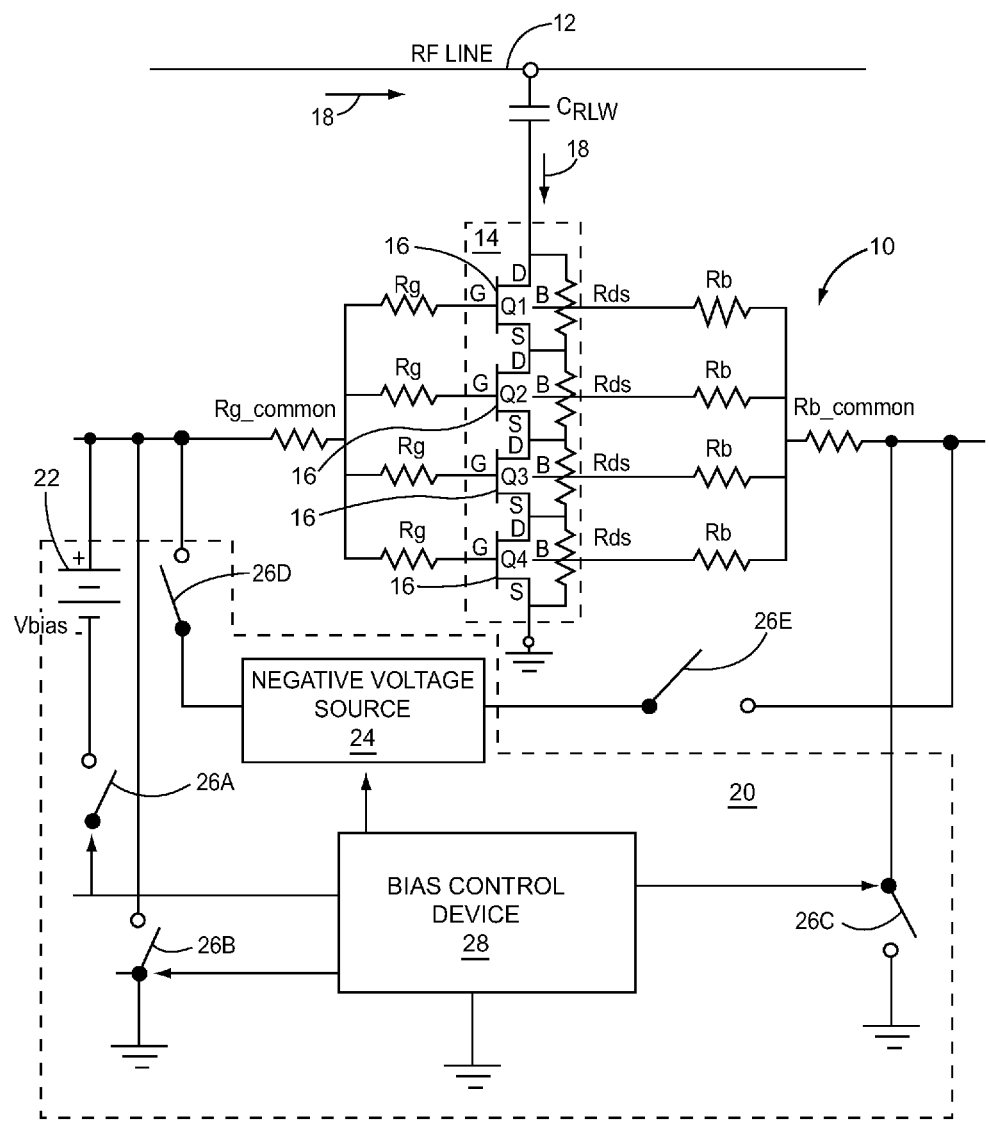
FIG. 1 illustrates a related art switchable capacitive element.
Figure 2:
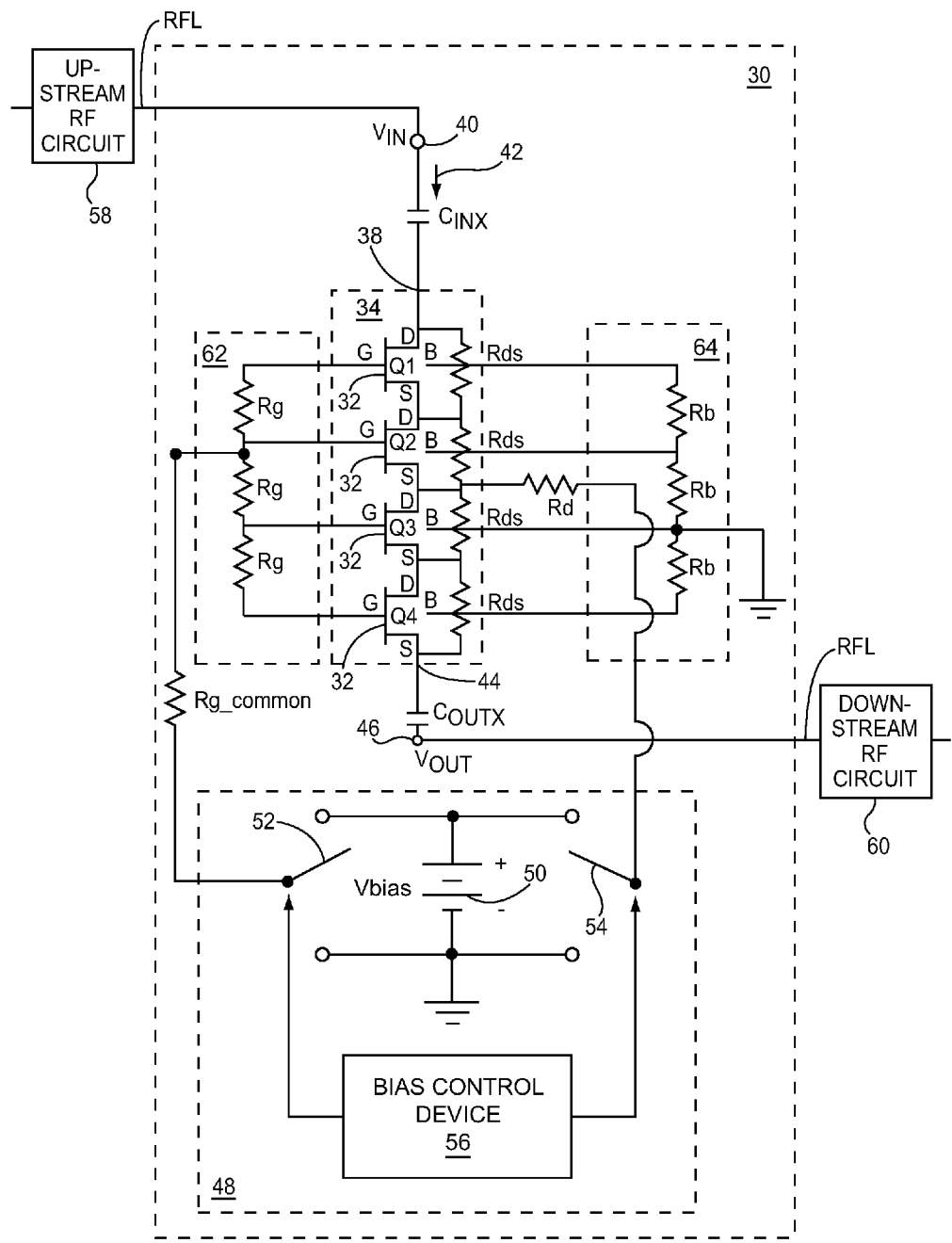
FIG. 2 illustrates one embodiment of a switchable capacitive element in accordance with this disclosure.

FIG. 2 illustrates one embodiment of a switchable capacitive element 30. The switchable capacitive element 30 includes a plurality of FET devices (referred to generically as elements 32 and individually as elements $Q_1$-$Q_4$) that are coupled in series to one another to form a FET device stack 34. In this embodiment, the FET device stack 34 has four (4) FET devices 32. However, as explained in further detail below, the FET device stack 34 may have any number of FET devices 32 greater than one (1). Each of the plurality of FET devices 32 has a source, a drain, and a gate. To provide electrical connections to the sources, drains, and gates, each of the plurality of FET devices 32 includes source contacts S, drain contacts D, and gate contacts G. In this example, each of the FET devices 32 also includes a body contact B to connect to a body of the FET device 32. However floating body embodiments that do not include a body contact B, and have bodies that are self-biased, can also be implemented in accordance with this disclosure.

The plurality of FET devices 32 is coupled in series to form a chain that has a first FET device $Q_1$, a second FET device $Q_2$, a third FET device $Q_3$, and a fourth FET device $Q_4$. In the illustrated FET device stack 34, the drain contact D of the first FET device $Q_1$ is positioned at a first end 38 of the FET device stack 34, and is coupled to an input terminal 40 for receiving a radio frequency (RF) signal 42. At a second end 44 opposite the first end 38 of the FET device stack 34, the fourth FET device $Q_4$ has a source contact S that is coupled to an output terminal 46. In this example, the input terminal 40 and the output terminal 42 are RF ports and the FET device stack 34 may be coupled in series within an RF line RFL. The voltages at the input terminal 40 and the output terminal 42 are $V_{in}$ and $V_{out}$. Alternatively, the output terminal 42 may be directly coupled to ground so that the switchable capacitive element 30 shunts the RF line RFL.

The FET device stack 34 may be formed, for example, on a silicon-on-insulator (SOI) type substrate, a silicon-on-sapphire (SOS) type substrate, a Gallium Arsenide (GaAs) type substrate, or the like. Each of the plurality of FET devices 32 in the FET device stack 34 may be a complementary metal-oxide-semiconductor (CMOS) type transistor, such as a metal-oxide-semiconductor field effect transistor (MOSFET). The FET devices 32 may also be metal semiconductor field effect transistors (MESFETs), high mobility field effect transistors (HFETs), or the like. SOI type substrates, SOS type substrates, and GaAs type substrates may be advantageous in some applications because of the high degree of insulation provided by their internal layers. For example, in an SOI type substrate, the FET devices 32 are formed on a device layer and an insulating layer (also known as a Buried Oxide [BOX] layer) may be provided between a handle layer and the device layer. The insulating layer is typically made from an insulating or dielectric type oxide material such as $SiO_2$, while the handle layer is typically made from a semiconductor, such as silicon (Si). The degradation in bandwidth normally associated with stacked FET devices 32 and the increased parasitic capacitances of the extra components are reduced by utilizing SOI, SOS, or GaAs type substrates and through other techniques provided in this disclosure for suppressing the loading effects of these parasitic capacitances. However, SOI type substrates, SOS type substrates, and GaAs type substrates are not required, and the particular substrate utilized to form the plurality of FET devices 32 should be determined in accordance with factors considered to be important for the particular desired application, such as a required bandwidth response, distortion tolerances, cost, and the like. Note that the sources and drains between one of the plurality of FET devices 32 and another one of the plurality of FET devices 32 may be independent of one another or may be merged into a single drain/source having drain and source contacts D, S for each FET device 32.

During an open state of the FET device stack 34, the plurality of FET devices 32 are off and the FET device stack 34 presents a high impedance between the first end 38 and the second end 44. Consequently, very little, if any, current is transmitted from the FET device stack 34 to the output terminal 46. On the other hand, in the closed state, each of the plurality of FET devices 32 has a low impedance and thus transmits the RF signal 42 to the output terminal 46.

To switch the FET device stack 34 between the open state and the closed state, the switchable capacitive element 30 has a control circuit 48 that is operably associated with the FET device stack 34. In this embodiment, the control circuit 48 has a DC voltage source 50, a first switch 52, a second switch 54, and a bias control device 56. The first switch 52 and the second switch 54 may be any type of suitable switch for providing the desired bias voltages. For example, the first switch 52 and the second switch 54 may be transistor switches or inverters. The control circuit 48 is connected to each of the gate contact G, the drain contact D of the first FET device $Q_1$ at the first end 38 of the FET device stack 34, and the source contact S of the fourth FET device $Q_4$ at the second end 44 of the FET device stack 34. To place the FET device stack 34 in the closed state, the control circuit 48 biases the gate contacts G of each of the plurality of FET devices 32 at a first voltage $+V_{bias}$ relative to a reference voltage. In this example, the reference voltage is $V_{out}$, which is biased externally to ground, and thus the reference voltage is ground. In alternative embodiments, the reference voltage may be at other voltage levels depending on the design requirements of the switchable capacitive element 30. If the FET devices 32 in the plurality of FET devices 32 are depletion mode type FET devices 32, the FET devices 32 in the plurality of FET devices 32 have a reverse biased pinch-off voltage $-V_p$. Since the first voltage $+V_{bias}$ is positive relative to the reference voltage (ground, in this case) and has a magnitude greater than the reverse biased pinch-off voltage $-V_p$, the FET devices 32 in the plurality of FET devices 32 are turned on by the first voltage $+V_{bias}$. For a depletion mode type FET device 32, the pinch-off voltage $-V_p$ is the voltage at the gate contact G relative to a voltage of the source contact S, at which a channel of the FET device 32 is pinched off. In other words, if a reverse bias greater than the pinch-off voltage $-V_p$ is applied between the gate contact G and the source contact S of the FET device 32, the FET device 32 is turned off and placed in the open state. On the other hand, the plurality of FET devices 32 may also be enhancement mode type FET devices 32. In this case, a forward-biased pinch-off voltage +$V_p$ (also known as a threshold voltage) is required to turn on the channel of the FET device 32. As a result, if a forward bias less than the pinch-off voltage +$V_p$ is applied between the gate contact G and the source contact S of the enhancement mode type FET device 32, the enhancement mode FET device 32 is turned off and placed in the open state. Accordingly, the FET devices 32 are placed in the closed state by the first voltage +$V_{bias}$ because the first voltage +$V_{bias}$ is greater than the pinch-off voltage +$V_p$ or −$V_p$, depending on the type of FET device 32.

In the embodiment illustrated in FIG. 2, all of the FET devices 32 in the plurality of FET devices 32 are the same type of FET device 32 and have essentially the same characteristics. For example, the FET devices 32 may all be considered to have relatively the same reverse biased pinch-off voltage −$V_p$. It should be noted that this is not required. In other embodiments, each or some of the plurality of FET devices 32 may be of different types and have different characteristics. In these alternative embodiments, the first voltage +$V_{bias}$ should be selected accordingly to provide the appropriate voltage for the channels of each of the FET devices 32 and place the FET device stack 34 in the closed state.

The control circuit 48 of FIG. 2 is connected to bias the drain contact D and the source contact S of each of the plurality of FET devices 32. In this embodiment, the control circuit 48 is connected to apply the bias from the control circuit 48 at the drain contact D of the first FET device $Q_1$ and the source contact S of the fourth FET device $Q_4$. However, the control circuit 48 may be connected, either directly or indirectly, to apply the bias voltage from the control circuit 48 at any one, more than one, or all of the drain contacts D and/or the source contacts S to provide the appropriate bias voltages. Different connections between the control circuit 48 and the FET device stack 34 may be advantageous or disadvantageous for different reasons. Sensitivity to turn-on times may be considered when determining the particular circuit topology for connecting the control circuit 48 with the FET device stack 34. Also, loading effects may be considered for the particular application. For example, the paths that connect the control circuit 48 to the drain contact D of the first FET device $Q_1$ and the source contact S of the fourth FET device $Q_4$ have resistors $R_s$ and $R_d$, which present a load to the first end 38 and second end 44 of the FET device stack 34, respectively. Resistors $R_s$ and $R_d$ may be advantageous to reduce distortion but may also cause leakage currents. Also, different types of filtering devices (not shown) and the like may be connected between the control circuit 48 and the FET device stack 34 to prevent the RF signal 42 from leaking into and damaging the control circuit 48. These and other circuit topologies for connecting the control circuit 48 to the FET device stack 34 would be apparent to one of ordinary skill in the art in light of this disclosure. Alternatively, the control circuit 48 may not be provided as part of the switchable capacitive element 30 but rather may be formed as an external component on the same or on a different semiconductor substrate.

Referring again to FIG. 2, the control circuit 48 applies a second voltage to the drain contact D of the first FET device $Q_1$ and the source contact S of the fourth FET device $Q_4$ during the closed state. The second voltage should be less than the first voltage, but non-negative relative to the reference voltage. In this embodiment, the second voltage is the same as the reference voltage, which in this case is ground; however, in other embodiments, higher voltages having a voltage level between the reference voltage and the first voltage may be selected. By applying the second voltage at the drain contact D of the first FET device $Q_1$ and the source contact S of the fourth FET device $Q_4$, the drain contacts D and the source contacts S of each of the plurality of FET devices 32 become biased at the second voltage. During the closed state, the gate contacts G of each of the plurality of FET devices 32 are biased at the first voltage relative to the source contacts S, which are at ground. As a result, the gate contacts G are biased above the reverse biased pinch-off voltage −$V_p$, relative to the source contacts S, and the FET device stack 34 operates in the closed state.

The control circuit 48 is also operable to place the FET device stack 34 in the open state by biasing the gate contacts G of the plurality of FET devices 32 at the second voltage (in this case, ground) relative to a reference voltage (in this case, ground). Also, the control circuit 48 applies a bias at the first voltage at the first end 38 to the drain contact D of the first FET device $Q_1$ and at the second end 44 to the source contact S of the fourth FET device $Q_4$. In the illustrated embodiment, the first voltage is at +$V_{bias}$ and may be approximately 2.5 volts. This, in turn, causes the drain contacts D and the source contacts S of each of the plurality of FET devices 32 to be positively biased at the first voltage +$V_{bias}$ relative to the reference voltage. As discussed above, the second voltage of the illustrated embodiment is the same as reference voltage, which is ground, and thus the gate contacts G of each of the plurality of FET devices 32 are biased at zero (0) volts relative to ground. Notice that while each of the gate contacts G of the plurality of FET devices 32 is non-negatively biased relative to the reference voltage, the gate contacts G are negatively biased at −$V_{bias}$ relative to the drain contacts D and the source contacts S. Selecting the magnitude of, the first voltage +$V_{bias}$ with respect to the pinch-off voltage, in this case −$V_p$, creates a buffer that prevents the RF signal 42 from forcing the FET device stack 34 out of the open state. This buffer can be expressed as the first voltage +$V_{bias}$ plus the pinch-off voltage −$V_p$, as shown below:

$$V_{buffer} = +V_{bias} + -V_p$$

Since the RF signal 42 must cause a voltage greater than +$V_{bias}$+−$V_p$ at the gate contacts G to turn on the FET devices $Q_1$-$Q_4$, a buffer of $V_{buffer}$=+$V_{bias}$−$V_p$ is provided that prevents the FET device stack 34 from being forced out of the open state. The FET devices 32 may have similar activation and impedance characteristics between the gate contact G and the drain contact D, and between the gate contact G and the source contact S, and thus the drains and sources of the FET devices 32 are congruent. In this case, biasing the drain contact D of the FET devices 32 also provides a buffer of +$V_{bias}$+−$V_p$ that prevents drain to gate activation of the FET devices 32 in the open state of the FET device stack 34. The FET devices 32 may have similar activation and deactivation characteristics between the gate contact G and the drain contact D, and between the gate contact G and the source contact S, and thus the drains and sources of the FET devices are congruent. As a result, biasing the drain contact D of the FET devices 32 also provides a buffer of +$V_{bias}$+−$V_p$ that prevents drain to gate activation of the FET devices 32 in the open state of the FET device stack 34. If, in the alternative, the drain and the source of one or more of the FET devices 32 are not congruent with one another, then the buffer may be different between the gate contact G and the drain contact D, and between the source contact S and the gate contact G, of the FET device 32.

For depletion mode type FET devices 32, the buffer is less than the magnitude of the first voltage +$V_{bias}$. However, for enhancement mode type FET devices 32, the buffer is greater than the magnitude of +$V_{bias}$, i.e., $V_{buffer}$=+$V_{bias}$++$V_p$. Note that the buffer $V_{buffer}$ is provided by the control circuit 48 without requiring the use of a negative voltage source, such as a negative-charge pump. In addition, the bias swing from the open state to the closed state and vice versa at the gate contacts G of each of the plurality of FET devices 32 is only the first voltage minus the second voltage. In this case, the first voltage is at +$V_{bias}$ and the second voltage is at ground, and thus the bias swing created by the control circuit is only |$V_{bias}$|. Since the voltage swing is not greater than |$V_{bias}$|, transition states are not needed to prevent the voltage between the drain contacts D and the gate contacts G of the FET devices 32 from exceeding the voltage handling capabilities of the FET devices 32 when transitioning to and from the open and closed states. In the embodiment illustrated in FIG. 2, the plurality of FET devices 32 have essentially the same characteristics. However, this is not necessarily the case, and in other embodiments, each or some of the plurality of FET devices 32 may be of different types having different characteristics. In these alternative embodiments, the first voltage +$V_{bias}$ should be selected accordingly to place the FET device stack 34 in the open state and provide the appropriate buffer without causing excessive bias swings.

Each of the plurality of FET devices 32 in the switchable capacitive element 30 of FIG. 2 has a body and a body contact B to bias the body of the FET device 32. The body contacts B of the plurality of FET devices 32 are biased to a bias voltage, in this case ground, whether the FET device stack 34 is in the open state or in the closed state. Biasing the body contact B of the plurality of FET devices 32 may be utilized to help define the voltages in the bodies of the plurality of FET devices 32 and reduce distortion. However, in the alternative, the plurality of FET devices 32 may not have body biasing. Alternative embodiments may have floating body designs even if the FET devices 32 are the type of FET devices 32 that require a negative bias between the transistor bodies and the drain and source contacts D, S to prevent the activation of reverse-body diodes when the FET device stack 34 is operating in the open state. While the body contacts B of the plurality of FET devices 32 in FIG. 2 are always biased to ground, the drain contacts D and the source contacts S are biased to the first voltage +$V_{bias}$ during the open state. Thus, the voltage bias seen between the body contacts B and the drain and source contacts D, S is a negative voltage, in this case -$V_{bias}$. Accordingly, a negative voltage is presented at the body contacts B relative to the drain and source contacts D, S without requiring a negative voltage source, such as a negative-voltage generator. As a result, the floating body topologies may be utilized even if the FET devices 32 are the type of FET devices 32 that require a negative bias to prevent the activation of reverse-body diodes.

As mentioned above, the control circuit 48 of FIG. 2 is operably associated with the gate contact G and the drain contact D of the first FET device $Q_1$, and the source contact S of the fourth FET device $Q_4$, to provide the appropriate bias voltages relative to the reference voltage. The bias voltage at the gate contact G is referred to as $V_G$, while the bias voltage at the drain contact D of the first FET device $Q_1$ and the source contact S of the fourth FET device $Q_4$ is referred to as $V_{stack}$. The bias voltages $V_G$ and $V_{stack}$ are presented in the Table II below.

TABLE II

| Switch State | $V_G$ | $V_{stack}$ |
|---|---|---|
| Open State | Second Voltage | First Voltage |
| Closed State | First Voltage | Second Voltage |

As mentioned above, the first voltage is positive relative to the reference voltage. The second voltage is non-negative relative to the reference voltage and is lower than the first voltage. For the embodiment illustrated in FIG. 2, the specific bias voltages $V_G$, $V_{stack}$ are shown in Table III below.

TABLE III

| Switch State | $V_G$ | $V_{stack}$ |
|---|---|---|
| Open State | Ground | +$V_{bias}$ |
| Closed State | +$V_{bias}$ | Ground |

The control circuit 48 of the switchable capacitive element 30 may be configured in any manner to provide the above-mentioned bias voltages $V_G$ and $V_{stack}$ in Tables II, III. The control circuit 48 may include, without limitation, logic controllers, sequential controllers, feedback controllers, and/or linear controllers. These and other control topologies would be apparent to one of ordinary skill in the art, as a result of this disclosure. The control circuit 48 may also receive and transmit control signals and/or have internal programming and memory to determine when to switch the FET device stack 34 to and from the open and the closed states. In addition, while the DC voltage source 50 is included within the illustrated embodiment of the control circuit 48, in other embodiments, the control circuit 48 may simply connect to an external voltage source(s) to provide the appropriate bias voltage.

As shown by Tables II and III, the switchable capacitive element 30 described in FIG. 2 does not require transition states when switching to and from the open state and the closed state. However, other embodiments may require transition states to prevent excessive loading of the FET devices 32 or to function appropriately with external devices. Thus, the control topology of the control circuit 48 may vary in accordance with the particular application for the switchable capacitive element 30. Also, while the second voltage should be non-negative relative to the reference voltage, practical considerations and non-ideal circuit behavior may cause the second voltage to be slightly negative with respect to the reference voltage. Although the second voltage would still remain substantially non-negative relative to reference voltage (in this case, ground), the second voltage may have a small negative difference (between approximately −0.1 volts and −0.2 volts) relative to the reference voltage.

Note that the input terminal 40 and the output terminal 46 in the switchable capacitive element 30 may be RF ports having RF voltages $V_{in}$ and $V_{out}$. In this case, the FET device stack 34 may be coupled in series within the RF line RFL. Thus, the reference voltage would be the network voltage $V_{out}$ of the RF line RFL at the output terminal 46. Also, while the second voltage should be non-negative relative to the reference voltage, practical considerations and non-ideal circuit behavior may cause the second voltage to be slightly negative with respect to the reference voltage. Although the second voltage would still remain substantially non-negative relative to reference voltage (in this case $V_{out}$), the second voltage may have a small negative difference (between approximately −0.1 volts and −0.2 volts) relative to the reference voltage. In any case, the small negative difference needs to have a magnitude of less than 10% of the magnitude of the first voltage relative to the reference voltage.

In this embodiment, the reference voltage for measuring the first and second voltage of Table II above is at $V_{out}$, which has been externally coupled to ground. In alternative embodiments, however, this may not be the case. The second voltage should be higher than the reference voltage $V_{out}$, and non-negative relative to the reference voltage $V_{out}$. Thus, $V_{out}$ may be a negative voltage with respect to ground, since ground should be higher and non-negative with respect to the reference voltage $V_{out}$. In this manner, the second voltage may be non-negative relative to the reference voltage $V_{out}$, even though the second voltage is negative relative to ground.

Next, the illustrated control circuit 48 includes the DC voltage source 50, the first switch 52, the second switch 54, and the bias control device 56. The positive terminal of the DC voltage source 50 provides the first voltage +$V_{bias}$, and the grounded terminal provides the second voltage at ground. Connected to the positive terminal and the negative terminal of the DC voltage source 50 are the first switch 52 and the second switch 54, which are operated by the bias control device 56. The first switch 52 connects to the gate contacts G of the plurality of FET devices 32 to provide the bias voltage $V_G$ at the gate contacts G. The second switch 54 is connected to the drain contact D of the first FET device $Q_1$, and the source contact S of the fourth FET device $Q_4$ to provide the bias voltage $V_{stack}$. The bias control device 56 controls the first switch 52 and the second switch 54, in accordance with Table III above, to switch the FET device stack 34 into and out of the open and closed states.

The switchable capacitive element 30 has a first capacitor $C_{INX}$ and a second capacitor $C_{OUTX}$. The first capacitor $C_{INX}$ and the second capacitor $C_{OUTX}$ allow the switchable capacitive element 30 to be provided in the open state and in the closed state without a negative voltage from a negative charge pump. In other words, the first capacitor $C_{INX}$ and the second capacitor $C_{OUTX}$ allow for the control circuit 48 to bias the plurality of FET devices 32 in accordance with Table III, while allowing the RF signal 42 to propagate from the input terminal 40 to the output terminal 46 when the FET device stack 34 is in the closed state. The first capacitor $C_{INX}$ and the second capacitor $C_{OUTX}$ also help to evenly distribute a voltage drop of the RF signal 42 when the FET device stack 34 is in the closed state across the FET device stack 34. The first and second capacitors $C_{INX}$, $C_{OUTX}$ also maintain the FET devices 32 in the FET device stack 34 appropriately biased in accordance with Table III during the open and closed states, and operate as a DC block to help isolate the biasing from the control circuit 48 to the FET device stack 34.

The first capacitor $C_{INX}$ and the second capacitor $C_{OUTX}$ are DC blockers that allow the drain contacts D and the source contacts S of the FET devices 32 to be biased. However, the first capacitor $C_{INX}$ and the second capacitor $C_{OUTX}$ are configured to pass the RF signal 42, which operates within an RF communication band. The first capacitor $C_{INX}$ is coupled in series with the FET device stack 34. The first capacitor $C_{INX}$ is also coupled to the first end 38 of the FET device stack 34. In this embodiment, the first capacitor $C_{INX}$ is coupled in series between the input terminal 40 and the first end 38 of the FET device stack 34. More specifically, the first capacitor $C_{INX}$ is connected in series between the drain contact D of the first FET device $Q_1$ and the input terminal 40.

Additionally, the second capacitor $C_{OUTX}$ is coupled in series with the FET device stack 34. The second capacitor $C_{OUTX}$ is also coupled to the second end 44 of the FET device stack 34. In this embodiment, the second capacitor $C_{OUTX}$ is coupled in series between the output terminal 46 and the second end 44 of the FET device stack 34. More specifically, the second capacitor $C_{OUTX}$ is connected in series between the source contact S of the fourth FET device $Q_4$ and the output terminal 46. Accordingly, the switchable capacitive element 30 may be useful in building programmable capacitor arrays (described below).

The first capacitor $C_{INX}$ has a first capacitance and the second capacitor $C_{OUTX}$ has a second capacitance. When the FET device stack 34 is in the closed state, the RF signal 42 passes from the input terminal 40 to the output terminal 46 and the switchable capacitive element 30 has a maximum capacitance. Since both the first capacitor $C_{INX}$ and the second capacitor $C_{OUTX}$ are coupled in series with the FET device stack 34, the first capacitance and the second capacitance present a series capacitance during the closed state of the FET device stack 34. In this embodiment, the maximum capacitance of the switchable capacitive element 30 is ideally equal to the series capacitance provided by the first capacitor $C_{INX}$ and the second capacitor $C_{OUTX}$. In practice, the maximum capacitance may not be precisely equal to the series capacitance provided by the first capacitor $C_{INX}$ and the second capacitor $C_{OUTX}$ due to parasitic capacitances from the other components in the switchable capacitive element 30.

When the FET device stack 34 is in the open state, the RF signal 42 does not pass through the switchable capacitive element 30. In this case, the switchable capacitive element 30 presents a minimum capacitance from the input terminal 40 to the output terminal 46. Ideally, the minimum capacitance is zero (0). However, in practice, the minimum capacitance may be greater than zero to due to parasitic capacitances from the other components in the switchable capacitive element 30. Still, the minimum capacitance should be negligible for the RF application and thus the minimum capacitance should be much smaller than the maximum capacitance. By providing both the first capacitor $C_{INX}$ and the second capacitor $C_{OUTX}$ in series with the FET device stack 34, the switchable capacitive element 30 can provide a better voltage handling capability in comparison to topologies using a single capacitor.

The switchable capacitive element 30 shown in FIG. 2 is coupled in series within the RF line RFL. In this embodiment, the input terminal 40 is coupled to an upstream RF circuit 58 and the output terminal 46 is coupled to a downstream RF circuit 60. The upstream RF circuit 58 may be configured to generate the RF signal 42 and the downstream RF circuit 60 may be configured to receive the RF signal 42 and provide additional processing. Both the upstream RF circuit 58 and the downstream RF circuit 60 may be formed on the same semiconductor substrate as the switchable capacitive element 30, or on a different semiconductor substrate. By switching the FET device stack 34 to and from the open state and the closed state, the switchable capacitive element 30 can be controlled to select whether the switchable capacitive element provides the minimum capacitance or the maximum capacitance between the upstream RF circuit 58 and the downstream RF circuit 60.

The switchable capacitive element 30 shown in FIG. 2 includes a resistive circuit 62 that is coupled to the gate contacts G of the plurality of FET devices 32. In this embodiment, the resistive circuit 62 includes a common resistor $R_{g\_common}$ and multiple resistors $R_g$. The resistors $R_g$ bijectively correspond to pairs of the gate contacts G from adjacent FET devices 32 within the FET device stack 34. More specifically, each of the resistors $R_g$ is coupled between a particular pair of the gate contacts G from adjacent FET devices 32 within the FET device stack 34. The resistive circuit 62 presents a high resistance at each of the gate contacts G relative to an impedance of the parasitic capacitances between the gate contacts G and the drain contacts D and the source contacts S of the plurality of FET devices 32, such that the parasitic capacitances are rendered negligible at the RF frequency of the RF signal 42. In this manner, the resistive circuit 62 does not load the FET device stack 34, and the FET device stack 34 reduces distortion while preserving bandwidth. Other alternative circuit topologies may be utilized to provide the high resistance. For example, and without limitation, all of the high resistance may be provided by a single resistor, such as $R_{g\_common}$, or alternatively, $R_{g\_common}$ may not be provided at all. Active devices, such as transistors, may also be utilized. These and other circuit topologies for the resistive circuit 62 would be apparent to one of ordinary skill in the art, in light of this disclosure.

Next, the embodiment of the switchable capacitive element 30 in FIG. 2 has a distribution network having resistors $R_{ds}$, where the resistors $R_{ds}$ bijectively correspond with the plurality of FET devices 32. More specifically, each resistor $R_{ds}$ is connected across the drain contact D and the source contact S of a particular one of the plurality of FET devices 32. These resistors, $R_{ds}$, may be sized to help handle power dissipation and provide impedance matching for impedances within the FET devices 32. This distribution may be done in conjunction with the parasitic coupling afforded by the parasitic capacitances of the FET devices 32 from the gate to source, gate to drain, body to source, gate to body, and/or body to drain. These parasitic capacitances may occur at high frequencies above the high pass filter poles of the FET device stack 34. Other circuit components, such as capacitors, may also be coupled across the drain contacts D and the source contacts S to help provide a more even distribution of a voltage drop of the RF signal 42 across the FET device stack 34 during the open state. The capacitors may be implemented utilizing metal-insulator-metal (MIM) capacitors. Alternatively or additionally, the parasitic capacitances of the plurality of FET devices 32 may also be used to provide better voltage drop distribution if desired.

The switchable capacitive element 30 may also include a resistive circuit 64 coupled to the body contacts B of the plurality of FET devices 32. The resistive circuit 64 includes a resistor $R_{b\_common}$ and resistors $R_b$. The resistors $R_b$ bijectively correspond to pairs of the body contacts B from adjacent FET devices 32 within the FET device stack 34. More specifically, each of the resistors $R_b$ is coupled between a particular pair of the body contacts B from adjacent FET devices 32 within the FET device stack 34. The resistance presented by the resistive circuit 64 at the body contacts B may be high relative to the parasitic capacitances between the bodies of the plurality of FET devices 32 and the source and drain contacts S, D at the RF frequency of the RF signal 42. Other alternative circuit topologies provide the high resistance at the body contacts, B. For example, and without limitation, all of the high resistance may be provided by a single resistor, such as $R_{b\_common}$, or alternatively, $R_{b\_common}$ may not be provided at all. Active devices, such as transistors, may also be utilized. These and other circuit topologies for the resistive circuit 64 would be apparent to one of ordinary skill in the art, as a result of this disclosure.

Additionally, a resistor $R_d$ is coupled in series with the second switch 54 in order for the control circuit 48 to bias the drain contacts D and the source contacts S of the plurality of FET devices 32. In this embodiment, the resistor $R_d$ is directly connected at the middle of the FET device stack 34. More specifically, the resistor $R_d$ is directly connected to the source contact S of the second FET device $Q_2$ and the drain contact D of the third FET device $Q_3$. Accordingly, the bias voltage from the second switch 54 is applied directly to the source contact S of the second FET device $Q_2$ and the drain contact D of the third FET device $Q_3$. The resistor $R_d$ should present a high resistance at each of the gate contacts G relative to the impedance of the parasitic capacitances between the gate contacts G and the drain contacts D and the source contacts S of the plurality of FET devices 32, such that the parasitic capacitances are rendered negligible at the RF frequency of the RF signal 42. Since the switchable capacitive element 30 is coupled in series between the upstream RF circuit 58 and the downstream RF circuit 60, a voltage magnitude of the voltage $V_{out}$ may be significant. By directly connecting the resistor $R_d$ to the middle of the FET device stack 34, the voltage drops across the FET device stack 34 are distributed relatively evenly. Note however, that leakage currents through the resistor $R_d$ may degrade a Q factor of the switchable capacitive element 30. Similarly, the resistor $R_{b\_common}$ and the resistor $R_{g\_common}$ are directly connected in the resistive circuits 62 and 64, respectively, near the middle of the FET device stack 34 to evenly distributed biasing.

It should be noted that if the FET devices 32 are CMOS type transistors built having a deep n-well, it may be desirable for the bias voltage at the body contacts B to be greater than the reference voltage to help avoid the activation of parasitic diodes under large signal conditions. To do this, the body contacts B may be coupled to the positive terminal of the DC voltage source 50, or to another internal or external voltage source, instead of ground. In other embodiments, the bodies of the FET devices 32 may be left floating and the deep n-well may be biased through a high value resistor to allow the deep n-well to self-bias under large signal conditions.

Figure 3:
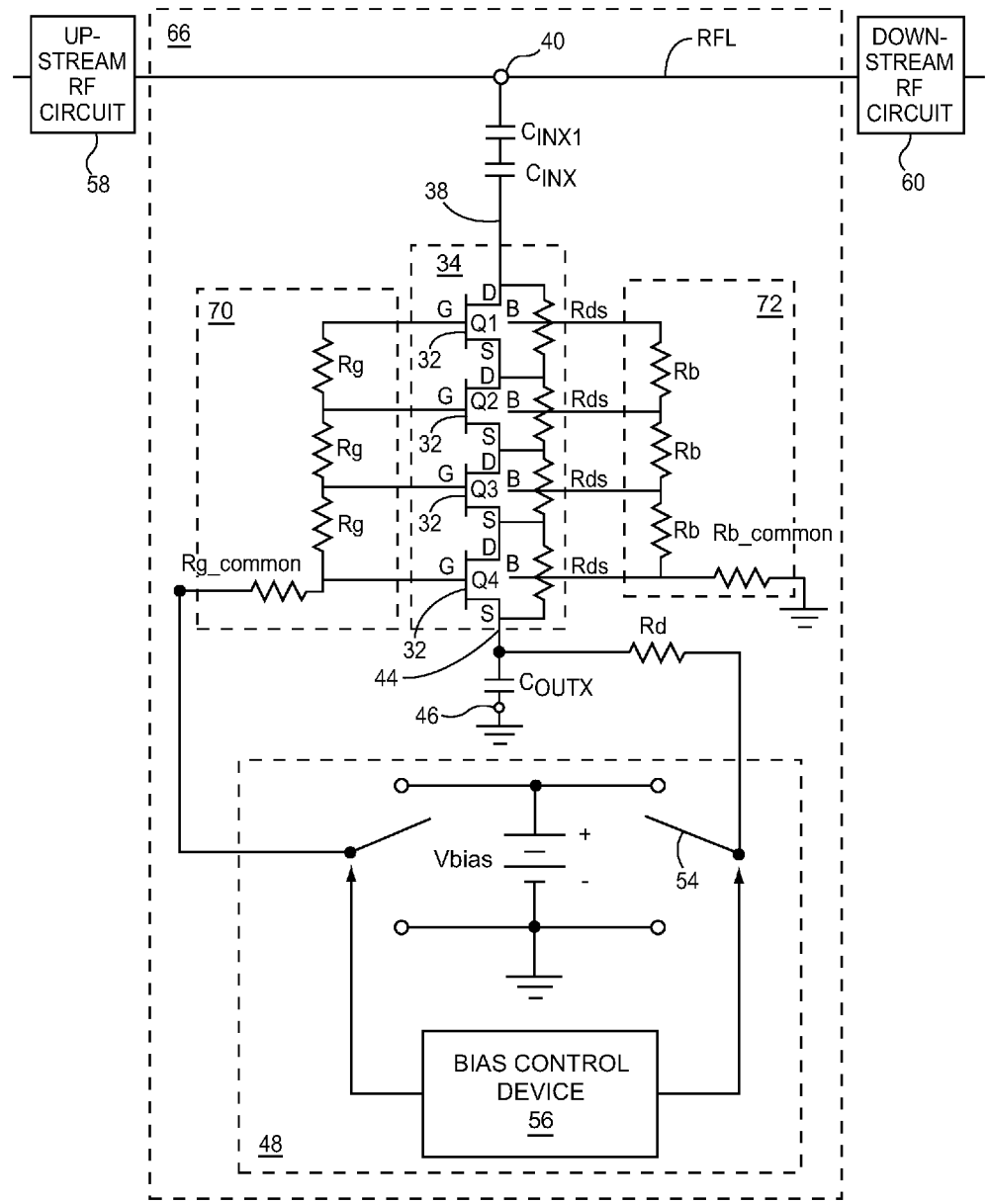
FIG. 3 illustrates another embodiment of a switchable capacitive element in accordance with this disclosure.

FIG. 3 illustrates another embodiment of a switchable capacitive element 66. The switchable capacitive element 66 is similar to the switchable capacitive element 30 described above with regard to FIG. 2, except that the switchable capacitive element 66 has a third capacitor $C_{INX1}$, the circuit topology of a resistive circuit 70 coupled to the gate contacts G, and the circuit topology of a resistive circuit 72, coupled to the body contacts B, where the resistor $R_d$ is coupled to the FET device stack 34. As shown in FIG. 3, the third capacitor $C_{INX1}$ is coupled in series with the first capacitor $C_{INX}$ and is coupled to the input terminal 40. The third capacitor $C_{INX1}$ has a third capacitance. As such, the first capacitor $C_{INX}$ and the third capacitor $C_{INX1}$ are coupled in series so as to provide a series capacitance. This series capacitance is the combination of the first capacitance and the third capacitance as seen between the input terminal 40 and the first end 38. Alternatively, there may be any number of capacitors from 1 to an integer N coupled in series between the input terminal 40 and the first end 38, where N can have any integer value.

In this embodiment, the second capacitance of the second capacitor $C_{OUTX}$ is significantly higher than the series capacitance of the first capacitor $C_{INX}$ and the third capacitor $C_{INX1}$, which are coupled in series. If parasitic capacitances are ignored, when the FET device stack 34 is in an open state, a maximum capacitance of the switchable capacitive element 66 would be a series capacitance of the second capacitance and the series capacitance of the combination of the first capacitance and the third capacitance. Additionally, the second capacitor $C_{OUTX}$ may be implemented as a high density capacitor since the voltage drop of the RF signal 42 across the second capacitor $C_{OUTX}$ may be minimal. As such, the first capacitor $C_{INX}$ has a first parasitic resistance, the second capacitor $C_{OUTX}$ has a second parasitic resistance, and the third capacitor $C_{INX1}$ has a third parasitic resistance. By providing the second capacitor $C_{OUTX}$ as the high density capacitor, the second parasitic resistance is lower than the first parasitic resistance and the second parasitic resistance is lower than the third parasitic resistance. Given that the second capacitance is higher than the series capacitance of the combination of the first capacitance and the third capacitance, and that the second parasitic resistance is lower than both the first parasitic resistance and the third parasitic resistance, the FET device stack 34 experiences a majority of the voltage drop from the RF signal 42 in the open state, while the first capacitor $C_{INX}$ and the third capacitor $C_{INX1}$ experience a majority of the voltage drop from the RF signal 42 in the closed state. This provides both an increase in the voltage-handling capability of the switchable capacitive element 66 and a higher Q factor.

Note that in this embodiment, the output terminal 46 is connected directly to ground. In this manner, the switchable capacitive element 66 is coupled in shunt with the RF line RFL. Since the voltage drop from the RF signal 42 is minimal at the second end 44, the second capacitor $C_{OUTX}$ can be implemented as a high density capacitor. Since the voltage drop of RF voltage 42 at the second end 44 is very small, substrate losses and losses from the resistive circuit 70, 72, and resistor $R_d$ can be minimized. As mentioned above, the second capacitor $C_{OUTX}$ may be formed so that the second parasitic resistance is low, to minimize losses. Since the second end 44 of the FET device stack 34 sees a very small voltage drop from the RF signal 42 both in the open state and in the closed state, insertion points of the resistors $R_{g\_common}$, $R_{b\_common}$, $R_d$ can now be moved to the ground side of the switchable capacitive element 66. In this example, the resistor $R_{g\_common}$ is connected directly to the gate contact G of the fourth FET device $Q_4$ at the second end 44 of the FET device stack 34. Furthermore, the resistor $R_{b\_common}$ is connected directly to the body contact B of the fourth FET device $Q_4$ at the second end 44 of the FET device stack 34. Additionally, the resistor $R_d$ is directly connected to the second end 44 (i.e., the source contact S of the fourth FET device $Q_4$) of the FET device stack 34. Since there is very little to no voltage drop of the RF signal 42 at the second end 44, both when the FET device stack 34 is in the open state and when the FET device stack 34 is in the closed state, the resistors $R_{g\_common}$, $R_{b\_common}$, $R_d$ add very little loss to no loss. This also has the benefit of reducing substrate-induced losses and nonlinearities.

In this embodiment, the input terminal 40 is connected to the RF line RFL between the upstream RF circuit 58 and the downstream RF circuit 60. The third capacitor $C_{INX1}$ is connected to the input terminal 40 and is connected in series with the first capacitor $C_{INX}$. The first capacitor $C_{INX}$ is connected to between the third capacitor $C_{INX1}$ and the first end 38 of the FET device stack 34. As mentioned above, the output terminal 46 is coupled to ground and is grounded. Accordingly, the second capacitor $C_{OUTX}$ is connected in series between the second end 44 of the FET device stack 34 and the output terminal 46, which is grounded. As such, the switchable capacitive element 66 is coupled in shunt between the upstream RF circuit 58 and the downstream RF circuit 60.

Figure 4:
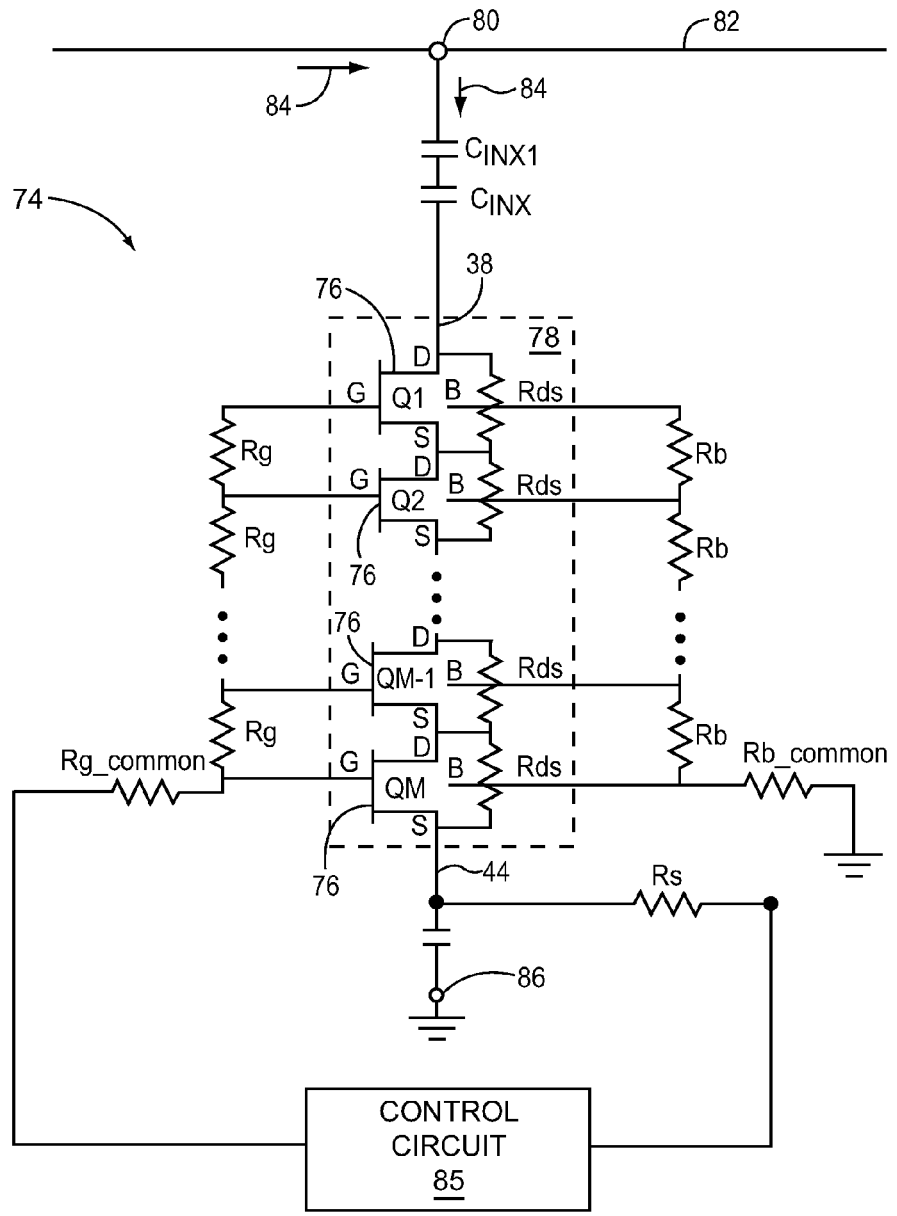
FIG. 4 illustrates yet another embodiment of a switchable capacitive element in accordance with this disclosure.

Referring now to FIG. 4, a switchable capacitive element 74 may have any plurality of FET devices (referred to generically as elements 76 and to a specific FET device as elements $Q_1$-$Q_M$) coupled in series to form a FET device stack 78. Thus, the FET device stack 78 is stacked from a first FET device $Q_1$ to a last FET device $Q_M$, where the number, M, of FET devices 76 may be any integer greater than 1. In the illustrated embodiment, the switchable capacitive element 74 has an input terminal 80 connected to an RF line 82 that transmits an RF signal 84 that operates within an RF communication band. During the closed state, the FET device stack 78 shunts the RF line 82 and transmits the RF signal 84 to an output terminal 86, which is connected to a reference voltage, in this case, ground. In the open state, the FET device stack 78 prevents the RF signal 84 from being shunted to ground. A control circuit 85 provides a first voltage and second voltage in accordance with Table III, which is discussed above.

Figure 5:
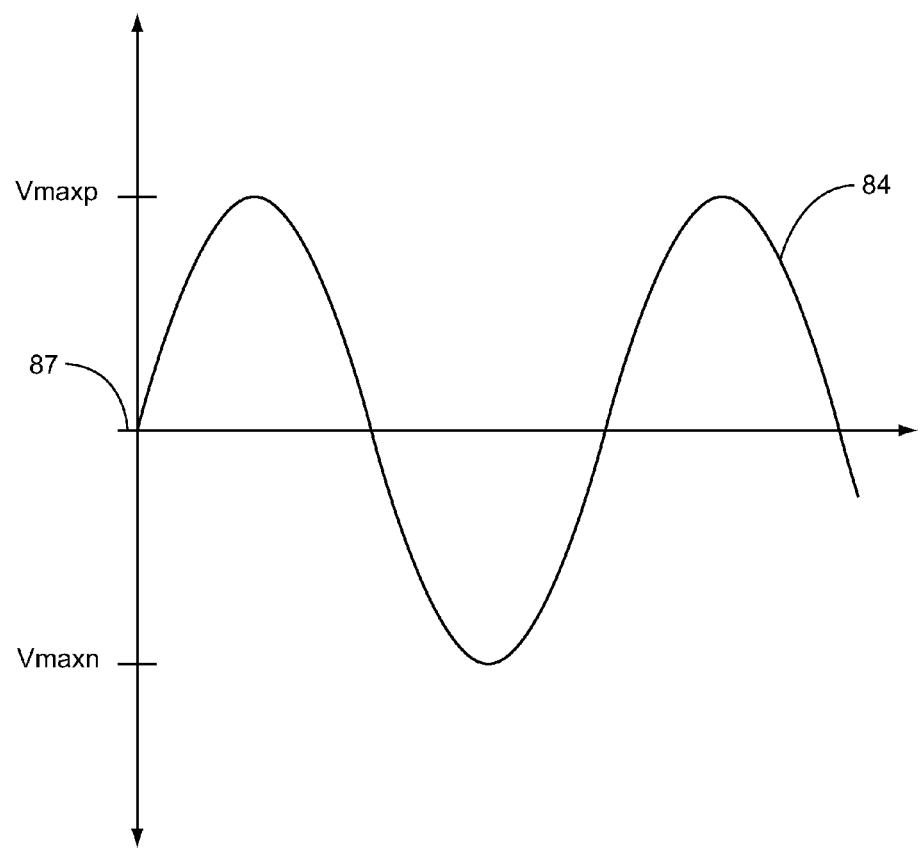
FIG. 5 illustrates one embodiment of a radio frequency (RF) signal.

Referring now to FIGS. 4 and 5, FIG. 5 illustrates one embodiment of an RF signal 84. The RF signal 84 illustrated in FIG. 5 is a sinusoidal voltage having a maximum positive peak voltage $V_{maxp}$ and a minimum negative peak voltage $V_{maxn}$ relative to a reference voltage 87, in this case, ground. The RF signal 84 is illustrated as a simplified sinusoidal voltage to help with the discussion of the switchable capacitive element 74. Accordingly, the maximum positive peak voltage $V_{maxp}$ and the minimum negative peak voltage $V_{maxn}$ have the same magnitude. Thus, the maximum peak voltage may be referred to as a maximum peak voltage $V_{max}$. However, the RF signal 84 may be any type of signal, such as, for example, an RF signal 84 that is more complex, or simpler, than the signal shown in FIG. 5. The RF signal 84 may actually consist of a plurality of combined signals, and may not be symmetrical. For example, the maximum positive peak voltage $V_{maxp}$ and the minimum negative peak voltage $V_{maxn}$ may be different for positive and negative cycles. Some RF signals 84 may not have either a positive or a negative cycle, and thus may be unicyclical, while others may actually not be periodic at all. These and other considerations should be taken into account when determining maximum peak voltage $V_{max}$, as would be apparent to one of ordinary skill in the art, as a result of this disclosure.

Each of the plurality of FET devices 76 may be associated with a reverse biased pinch-off voltage $-V_p$ and a breakdown voltage $-V_{Break}$. The pinch-off voltage $-V_p$ of a depletion mode FET device 76 is the reverse bias voltage at the gate contact G relative to a voltage of the source contact S at which the FET device 76 is opened. If a reverse bias less than or equal to the pinch-off voltage $-V_p$ is applied between the gate contact G and the source contact S of the FET device 76, a channel of the FET device 76 is pinched off and the FET device 76 is deactivated. If the FET devices 76 have congruent drains and sources, the pinch-off voltage $-V_p$ is applicable to the activation voltage from the gate contact G to the source contact S for the FET device 76, as well. The breakdown voltage $-V_{Break}$ is the voltage between the drain contact D and the gate contact G at which the FET device 76 begins to conduct when in the open state. In other words, if a negative voltage equal to or greater than the breakdown voltage $-V_{Break}$ is applied between the drain contact D and the gate contact G, the FET device 76 breaks down and begins to conduct. In FIG. 4, the plurality of FET devices 76 all have essentially the same characteristics and thus are associated with the same pinch-off voltage $-V_p$ and breakdown voltage $-V_{Break}$. However, as discussed above, in other embodiments, the characteristics of the FET devices 76 may be different, and thus, each may be associated with different pinch-off voltages and/or breakdown voltages.

Figure 6:
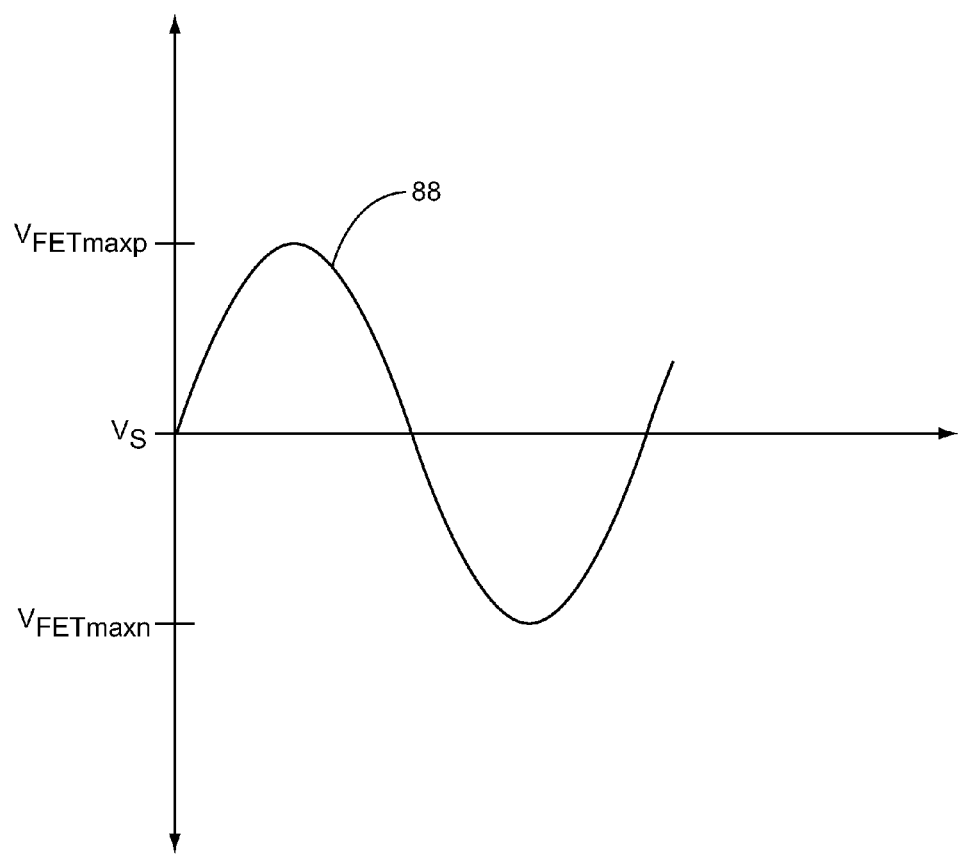
FIG. 6 illustrates a voltage at each of the drain contacts relative to the source contacts when a field effect transistor (FET) device stack in FIG. 4 is in an open state.

Referring now to FIGS. 4 and 6, FIG. 6 is a graph of a voltage signal 88 at the drain contacts D of each of the FET devices 76 relative to the source contact S of each of the FET devices 76 during the open state of the FET device stack 78. Note that this is relative to the source contact S, and not to ground. The voltage signal 88 for each of the drain contacts D relative to ground is clearly different for each of the FET devices 76. The FET devices 76 positioned higher in the stack would have a drain voltage with greater positive and negative voltage peaks relative to ground. The drain voltage of the first FET device $Q_1$ relative to ground would be essentially the same as the RF signal 84 (shown in FIG. 5) plus a biasing voltage $+V_{bias}$, while the drain voltage of the last FET device $Q_M$ would be essentially the same as the voltage signal 88 relative to ground plus the biasing voltage $+V_{bias}$. However, since the RF signal 84 may be evenly distributed across each of the FET devices 76, the drain voltages are relatively uniform with respect to their source contact S. Also, the biasing voltage $+V_{bias}$ cancels out the voltage signal 88, since both the drain contact D and the source contact S are biased by the biasing voltage $+V_{bias}$ during the open state.

As illustrated, the voltage signal 88 has a maximum positive peak voltage $V_{FETmaxp}$ and a minimum negative peak voltage $V_{FETmaxn}$, and thus the maximum peak voltage is $V_{FETmax}$. The relationship between $V_{max}$ and $V_{FETmax}$ can be expressed as:

$$V_{FETmax} = \frac{V_{max}}{M}$$

Figure 7:
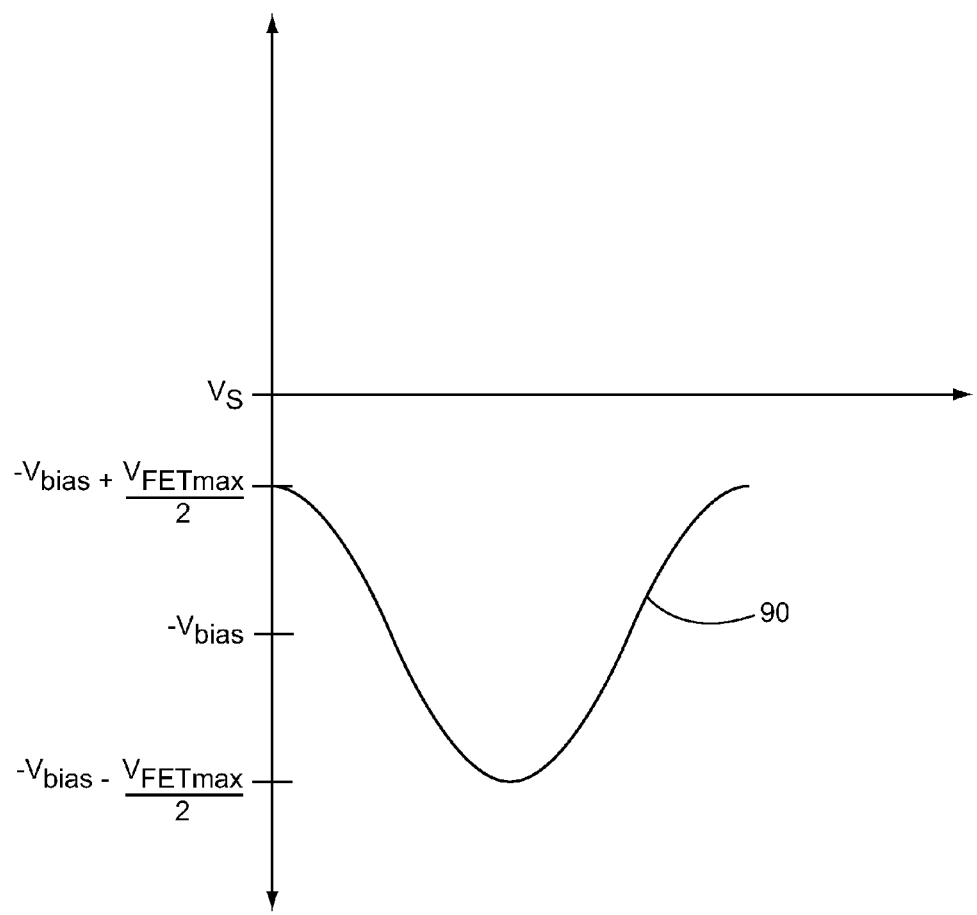
FIG. 7 illustrates a voltage of each of the gate contacts relative to the source contacts when the FET device stack in FIG. 4 is in the open state.

Referring now to FIG. 4 and FIG. 7, FIG. 7 illustrates a voltage signal 90 at the gate contact G of each of the plurality of FET devices 76, relative to the source contact S of the FET device 76 during the open state. For each of the FET devices 76 shown in FIG. 4, half of the voltage drop for the voltage signal 88 (shown in FIG. 6) occurs between the drain contact D and the gate contact G, and the other half occurs between the gate contact G and the source contact S, if we assume that the drains and sources of the FET devices 76 are congruent and have substantially the same impedance characteristics. Note that the gate contact G of each of the plurality of FET devices 76 appears negatively biased at since the drain and source contacts D, S of each of the FET devices 76 are positively biased by the first voltage $+V_{bias}$. Consequently, the voltage signal 90 is centered at the negative bias $-V_{bias}$, and has a maximum positive-cycle peak voltage $$-V_{bias} + \frac{V_{FETmax}}{2}$$

and a maximum negative-cycle peak voltage $$-V_{bias} - \frac{V_{FETmax}}{2}.$$

To maintain the FET devices 76 in the open state, the voltage signal 90 must not be greater than the reverse-biased pinch-off voltage $-V_p$ during the positive cycle. The upper limit of the maximum peak voltage, $$-V_{bias} + \frac{V_{FETmax}}{2},$$

can thus be expressed as:

$$-V_{bias} + \frac{V_{FETmax}}{2} = -V_p$$

Since the voltage between the drain contacts D and the gate contacts G at the minimum peak voltage $$-V_{bias} - \frac{V_{FETmax}}{2}$$

cannot exceed the negative breakdown voltage $-V_{Break}$, the lower limit of the minimum peak voltage $$-V_{bias} - \frac{V_{FETmax}}{2},$$

as seen from gate to drain, can be expressed as:

$$-V_{bias} - \frac{V_{FETmax}}{2} = -V_{Break}$$

From these two equations, the highest allowable value of the maximum peak voltage $V_{FETmax}$ can be solved as:

$$V_{FETmax} = |V_{Break}| + -V_p$$

Also, from the two equations, we can solve for the magnitude of the first voltage $+V_{bias}$ relative to ground. This may be expressed as:

$$|V_{bias}| = \frac{|V_{Break}| + -V_p}{2}$$

If the maximum peak voltage $V_{max}$ of the RF signal 84 reaches a maximum voltage $V_{pk}$, then the number M of the FET devices 76 needed to safely utilize the FET device stack 78 may be expressed as:

$$M \geq \frac{V_{pk}}{(|V_{Break}| + -V_p)}$$

The number M of the FET devices 76 thus may determine the maximum rated voltage that can be handled by the FET device stack 78.

It should be noted that the equations shown above are estimates for the described values of the switchable capacitive element 74 illustrated in FIG. 4. In actual practice, these values may vary from the aforementioned equations as a result of non-ideal behavior of the electronic components in the switchable capacitive element 74. In other embodiments, the relationships described by the aforementioned equations may be different depending on the particular circuit topology and electronic components utilized for the switchable capacitive element 74. For example, the aforementioned equations have been determined under the assumption that the FET devices 76 are depletion mode type FET devices 76. However, enhancement mode type FET devices 76 may also be utilized in the switchable capacitive element 74. One of ordinary skill in the art would be able to reformulate the relationships expressed by the aforementioned equations in accordance with non-ideal circuit behavior and the particular circuit topology and electronic components utilized to form the switchable capacitive element 74 in light of this disclosure.

Figure 8:
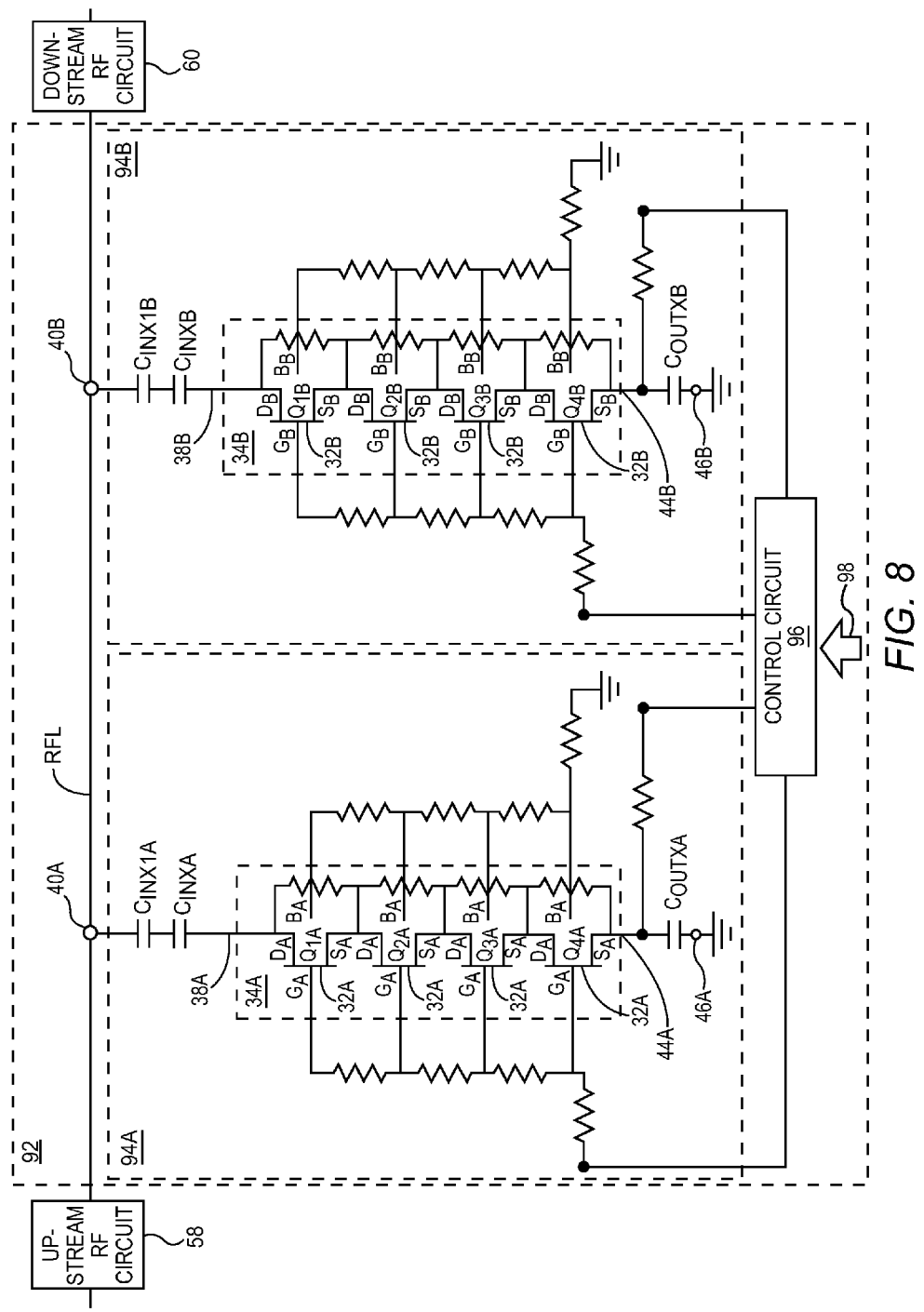
FIG. 8 illustrates one embodiment of a programmable capacitor array (PCA) that includes a plurality of switchable capacitive elements that are selectable by a control circuit.

FIG. 8 illustrates an embodiment of a programmable capacitor array (PCA) 92. The PCA 92 includes a plurality of switchable capacitive elements (referred to generically as elements 94 and specifically as elements 94A and 94B). In this embodiment, the PCA 92 includes two switchable capacitive elements 94, a first capacitive element 94A and a second capacitive element 94B. However, alternative embodiments of the PCA 92 may include any integer number of the switchable capacitive elements 94 greater than one (1). In addition, each of the switchable capacitive elements 94 shown in FIG. 8 is an embodiment of the switchable capacitive element 66 described above in FIG. 3. Other embodiments of the PCA 92 may have switchable capacitive elements 94 with any of the configurations described in this disclosure. Furthermore, while the switchable capacitive elements 94 shown in FIG. 8 have identical configurations, other embodiments of the PCA 92 may have switchable capacitive elements 94 with different configurations.

Just like the switchable capacitive element 66 shown in FIG. 3, the first switchable capacitive element 94A in FIG. 8 includes a first capacitor $C_{INXA}$, a second capacitor $C_{OUTXA}$, and a third capacitor $C_{INX1A}$. The first switchable capacitive element 94A also includes a first plurality of FET devices (referred to generically as elements 32A and specifically as elements $Q_{1A}$-$Q_{4A}$) coupled in series to form a first FET device stack 34A. Each of the first plurality of FET devices 32A has a drain contact $D_A$, a source contact $S_A$, and a gate contact $G_A$. The first capacitor $C_{INXA}$ is coupled to a first end 38A of the first FET device stack 34A and is coupled in series with the first FET device stack 34A. The second capacitor $C_{OUTXA}$ is coupled to a second end 44A of the first FET device stack 34A opposite the first end 38A, and is coupled in series with the first FET device stack 34A. Just like the first FET device stack 34 in FIG. 3, the first FET device stack 34A is operable in an open state and in a closed state.

The first switchable capacitive element 94A includes a first input terminal 40A and a first output terminal 46A. In this embodiment, the first input terminal 40A is connected to the RF line RFL and is thus coupled to the upstream RF circuit 58 and the downstream RF circuit 60. The first output terminal 46A is grounded. Thus, the first switchable capacitive element 94A is coupled in shunt between the upstream RF circuit 58 and the downstream RF circuit 60. As shown in FIG. 8, the first capacitor $C_{INXA}$ is coupled in series between the first input terminal 40A and the first end 38A of the first FET device stack 34A. More specifically, the first capacitor $C_{INXA}$ is connected in series with the first end 38A and in series with the third capacitor $C_{INX1A}$. The third capacitor $C_{INX1A}$ is directly connected to the first input terminal 40A. The second capacitor $C_{OUTXA}$ is coupled in series between the second end 44A and the first output terminal 46A. More specifically, the second capacitor $C_{OUTXA}$ is connected in series with the second end 44A of the first FET device stack 34A and is directly connected to the first output terminal 46A.

Also, just like the switchable capacitive element 66 shown in FIG. 3, the second switchable capacitive element 94B in FIG. 8 includes a fourth capacitor $C_{INXB}$, a fifth capacitor $C_{OUTXB}$, and a sixth capacitor $C_{INX1B}$. The second switchable capacitive element 94B also includes a second plurality of FET devices (referred to generically as elements 32B and specifically as elements $Q_{1B}$-$Q_{4B}$) coupled in series to form a second FET device stack 34B. Each of the second plurality of FET devices 32B has a drain contact $D_B$, a source contact $S_B$, and a gate contact $G_B$. The fourth capacitor $C_{INXB}$ is coupled to a third end 38B of the second FET device stack 34B and is coupled in series with the second FET device stack 34B. The fifth capacitor $C_{OUTXB}$ is coupled to a fourth end 44B of the second FET device stack 34B opposite the third end 38B and is coupled in series with the second FET device stack 34B. Just like the first FET device stack 34 in FIG. 3, the second FET device stack 34B is operable in an open state and in a closed state.

The second switchable capacitive element 94B includes a second input terminal 40B and a second output terminal 46B. In this embodiment, the second input terminal 40B is connected to the RF line RFL and is thus coupled to the upstream RF circuit 58 and the downstream RF circuit 60. The second output terminal 46B is grounded. Thus, the second switchable capacitive element 94B is coupled in shunt between the upstream RF circuit 58 and the downstream RF circuit 60. As shown in FIG. 8, the fourth capacitor $C_{INXB}$ is coupled in series between the second input terminal 40B and the third end 38B of the second FET device stack 34B. More specifically, the fourth capacitor 38B is connected in series with the third end 38B and in series with the sixth capacitor $C_{INX1B}$. The sixth capacitor $C_{INX1B}$ is directly connected to the second input terminal 40B. The fifth capacitor $C_{OUTXB}$ is coupled in series between the fourth end 44B and the second output terminal 46B. More specifically, the fifth capacitor $C_{OUTXB}$ is connected in series with the fourth end 44B of the second FET device stack 34B and is directly connected to the second output terminal 46B. Accordingly, the first switchable capacitive element 94A of the PCA 92 and the second switchable capacitive element 94B of the PCA 92 are coupled in parallel with respect to one another and in shunt with the RF line RFL and with respect to the upstream RF circuit 58 and the downstream RF circuit 60. In alternative embodiments, the first switchable capacitive element 94A of the PCA 92 and the second switchable capacitive element 94B of the PCA 92 may coupled in parallel with respect to one another and in series within the RF line RFL and with respect to the upstream RF circuit 58 and the downstream RF circuit 60.

As is known in the art, PCAs (like the PCA 92 shown in FIG. 8), also known as digitally tunable capacitors, contain switches (such as the FET device stacks 34A, 34B) that open and close paths to different capacitors or sets of capacitors (such as the set of the first capacitor $C_{INXA}$, the second capacitor $C_{OUTXA}$, and the third capacitor $C_{INX1A}$ in the first switchable capacitive element 94A and the set of the fourth capacitor $C_{INXB}$, the fifth capacitor $C_{OUTXB}$, and the sixth capacitor $C_{INX1B}$ in the second switchable capacitive element 94B) to vary the capacitance of the PCA. These PCAs are often utilized in RF circuits, such as antenna tuners. Proper calibration of the first capacitor $C_{INXA}$ and the second capacitor $C_{OUTXA}$ in an array of switchable capacitive elements, each like the switchable capacitive element 30 in FIG. 2, may allow one or more control circuits 48 to vary the capacitance of the PCA by selecting which of the switchable capacitive elements to open and close.

The first FET device stack 34A and the second FET device stack 34B of the second switchable capacitive element 94B are each controlled independently of one another. Note that the first capacitor $C_{INXA}$ has a first capacitance, the second capacitor $C_{OUTXA}$ has a second capacitance, and the third capacitor $C_{INX1A}$ has a third capacitance, while the fourth capacitor $C_{INXB}$ has a fourth capacitance, the fifth capacitor $C_{OUTXB}$ has a fifth capacitance, and the sixth capacitor $C_{INX1B}$ has a sixth capacitance. However, the first capacitance of the first capacitor $C_{INXA}$ may be different from the fourth capacitance of the fourth capacitor $C_{INXB}$, the second capacitance of the second capacitor $C_{OUTXA}$ may be different from the fifth capacitance of the fifth capacitor $C_{OUTXB}$, and the third capacitance of the third capacitor $C_{INX1A}$ may be different from the sixth capacitance of the sixth capacitor $C_{INX1B}$. Accordingly, a maximum capacitance of the first switchable capacitive element 94A is different that a maximum capacitance of the second switchable capacitive element 94B.

The PCA 92 shown in FIG. 8 therefore has a variable capacitance that can be set to four (4) discrete capacitive values corresponding to various combinations of open states and closed states of the first FET device stack 34A and the second FET device stack 34B. For example, a first one of the discrete capacitive values is provided when both the first FET device stack 34A and the second FET device stack 34B are in the open state. A second one of the discrete capacitive values is provided when the first FET device stack 34A is in the open state and the second FET device stack 34B is in the closed state. A third one of the discrete capacitive values is provided when the first FET device stack 34A is in the closed state and the second FET device stack 34B is in the open state. A fourth one of the discrete capacitive values is provided when both the first FET device stack 34A and the second FET device stack 34B are in the closed state. Note that if the first capacitance of the first capacitor $C_{INXA}$ is the same as the fourth capacitance of the fourth capacitor $C_{INXB}$, the second capacitance of the second capacitor $C_{OUTXA}$ is the same as the fifth capacitance of the fifth capacitor $C_{OUTXB}$, and the third capacitance of the third capacitor $C_{INX1A}$ is the same as the sixth capacitance of the sixth capacitor $C_{INX1B}$, a maximum capacitance of the first switchable capacitive element 94A would be the same as a maximum capacitance of the second switchable capacitive element 94B. In this case, the variable capacitance of the PCA 92 could only be set to three (3) discrete capacitive values (i.e., the variable capacitance would be the same whenever the first FET device stack 34A and the second FET device stack 34B were in opposite states). As mentioned above, alternative embodiments of the PCA 92 may have any integer number of switchable capacitive elements 94 greater than one (1). Assuming that maximum capacitances of each of the switchable capacitive elements 94 are all different, the variable capacitance could be set to $2^N$ discrete values.

The PCA 92 shown in FIG. 8 includes a control circuit 96 configured to control both the first FET device stack 34A and the second FET device stack 34B. However, the control circuit 96 is configured so that the first FET device stack 34A and the second FET device stack 34B are opened and closed independently. In this manner, the variable capacitance of the PCA 92 can be set to the four (4) discrete capacitive values. The control circuit 96 is configured to set the first FET device stack 34A of the first switchable capacitive element 94A in the open state and the closed state, as described above in Tables II and III. In this example, it is assumed that the control circuit 96 sets the first switchable capacitive element 94A in the open state and in the closed state in accordance with Table III above. Similarly, control circuit 96 is configured to set the second FET device stack 34B of the second switchable capacitive element 94B in the open state and the closed state, as described above in Tables II and III. In this example, it is assumed that the control circuit 96 sets the first switchable capacitive element 94A in the open state and in the closed state in accordance with Table III above.

To determine the states of the first FET device stack 34A and the second FET device stack 34B, and thereby to set the variable capacitance of the PCA 92 to a particular one of the discrete capacitance values, the control circuit 96 is configured to receive a control input 98. The control input 98 may be a control word, where the bits in the control word bijectively correspond to the switchable capacitive elements 94. Accordingly, each bit in the control word may indicate a selected state (either the open state or the closed state) of a particular one of the switchable capacitive elements 94.

In this embodiment, the control input 98 is a 2-bit word, where a first bit is indicative of a first selected state for the first switchable capacitive element 94A and a second bit is indicative of a second selected state for the second switchable capacitive element 94B. The first selected state may be any one of either the closed state of the first FET device stack 34A or the open state of the first FET device stack 34A, depending on a bit value (logical "0" or logical "1") of the first bit. Similarly, the second selected state may be any one of either the closed state of the second FET device stack 34B or the open state of the second FET device stack 34B, depending on a bit value (logical "0" or logical "1") of the second bit.

With regard to the first switchable capacitive element 94A, the control circuit 96 is configured to bias the gate contact $G_A$ of each of the first plurality of FET devices 32A at the first voltage $+V_{bias}$ in response to the control input 98 being received as indicative of the first selected state being the closed state of the first FET device stack 34A. Also, in response to the control input 98 being received as indicative of the first selected state being the closed state of the first FET device stack 34A, the control circuit 96 is configured to bias the drain contact $D_A$ and the source contact $S_A$ of each of the first plurality of FET devices 32A at the second voltage, in this case the reference voltage (i.e., ground). On the other hand, the control circuit 96 is configured to bias the gate contact $G_A$ of each of the first plurality of FET devices 32A at the second voltage (i.e., ground) in response to the control input 98 being received as indicative of the first selected state being the open state of the first FET device stack 34A. Furthermore, in response to the control input 98 being received as indicative of the first selected state being the open state of the first FET device stack 34A, the control circuit 96 is configured to bias the drain contact $D_A$ and the source contact $S_A$ of each of the first plurality of FET devices 32A at the first voltage $+V_{bias}$.

With regard to the second switchable capacitive element 94B, the control circuit 96 is configured to bias the gate contact $G_B$ of each of the second plurality of FET devices 32B at the first voltage $+V_{bias}$, in response to the control input 98 being received as indicative of the second selected state being the closed state of the second FET device stack 34B. Also, in response to the control input 98 being received as indicative of the second selected state being the closed state of the second FET device stack 34B, the control circuit 96 is configured to bias the drain contact $D_B$ and the source contact $S_B$ of each of the second plurality of FET devices 32B at the second voltage, in this case the reference voltage (i.e., ground). On the other hand, the control circuit 96 is configured to bias the gate contact $G_B$ of each of the second plurality of FET devices 32B at the second voltage (i.e., ground) in response to the control input 98 being received as indicative of the second selected state being the open state of the second FET device stack 34B. Furthermore, in response to the control input 98 being received as indicative of the second selected state being the open state of the second FET device stack 34B, the control circuit 96 is configured to bias the drain contact $D_B$ and the source contact $S_B$ of each of the second plurality of FET devices 32B at the first voltage $+V_{bias}$.

Those skilled in the art will recognize improvements and modifications to the preferred embodiments of the present disclosure. All such improvements and modifications are considered within the scope of the concepts disclosed herein and the claims that follow.

What is claimed is:
1. A switchable capacitive element comprising:
  a field effect transistor (FET) device stack that is operable in an open state and in a closed state, the FET device stack comprising a plurality of FET devices coupled in series to form the FET device stack;
  a first capacitor coupled to a first end of the FET device stack and being coupled in series with the FET device stack; and
  a second capacitor coupled to a second end of the FET device stack opposite the first end of the FET device stack and being coupled in series with the FET device stack;

a third capacitor coupled in series with the first capacitor so that the first capacitor and the third capacitor provide a series capacitance;

wherein the second capacitor has an other capacitance, wherein the other capacitance of the second capacitor is higher than the series capacitance of the first capacitor and the third capacitor.

2. The switchable capacitive element of claim 1 wherein each of the plurality of FET devices comprises a drain contact, a source contact, and a gate contact, and wherein the switchable capacitive element further comprises:

a control circuit operably associated with the FET device stack, the control circuit being configured to:
bias the gate contact of each of the plurality of FET devices at a first voltage such that the FET device stack operates in the closed state, the first voltage being positive relative to a reference voltage; and
bias the gate contact of each of the plurality of FET devices at a second voltage and bias the drain contact and source contact of each of the plurality of FET devices at the first voltage, such that the FET device stack operates in the open state, the second voltage being lower than the first voltage and approximately non-negative relative to the reference voltage.

3. The switchable capacitive element of claim 2 wherein the second voltage is the same as the reference voltage.

4. The switchable capacitive element of claim 2, wherein the second voltage is non-negative relative to the reference voltage.

5. The switchable capacitive element of claim 2, wherein the control circuit is further configured to bias the drain contact and the source contact of each of the plurality of FET devices at the second voltage during the closed state of the FET device stack.

6. The switchable capacitive element of claim 5 wherein:
each of the plurality of FET devices is a type of FET device that is associated with a breakdown voltage and a pinch-off voltage; and
a magnitude of the first voltage can be estimated to be half of a magnitude of the breakdown voltage associated with the plurality of FET devices plus the pinch-off voltage associated with the plurality of FET devices.

7. The switchable capacitive element of claim 1 further comprising an input terminal and an output terminal, wherein:
the first capacitor and the third capacitor are coupled in series between the input terminal and the first end of the FET device stack; and
the second capacitor is coupled in series between the output terminal and the second end of the FET device stack.

8. The switchable capacitive element of claim 7 wherein:
each of the plurality of FET devices comprises a drain contact, a source contact, and a gate contact; and
the plurality of FET devices comprises at least a first FET device and a second FET device, the drain contact of the first FET device being at the first end of the FET device stack and the source contact of the second FET device being at the second end of the FET device stack.

9. The switchable capacitive element of claim 8 wherein:
the first capacitor and the third capacitor are coupled in series between the input terminal and the drain contact of the first FET device; and
the second capacitor is coupled in series between the source contact of the second FET device and the output terminal.

10. The switchable capacitive element of claim 7 wherein the input terminal is coupled to an upstream radio frequency (RF) circuit, and the output terminal is coupled to a downstream RF circuit such that the switchable capacitive element is coupled in series between the upstream RF circuit and the downstream RF circuit.

11. The switchable capacitive element of claim 7 wherein the input terminal is coupled to an upstream RF circuit and a downstream RF circuit, and the output terminal is grounded such that the switchable capacitive element is coupled in shunt between the upstream RF circuit and the downstream RF circuit.

12. The switchable capacitive element of claim 1 wherein:
the first capacitor has a first parasitic resistance;
the second capacitor has a second parasitic resistance; and
the third capacitor has a third parasitic resistance, wherein the second parasitic resistance is greater than the first parasitic resistance, and the second parasitic resistance is greater than the third parasitic resistance.

13. The switchable capacitive element of claim 1 further comprising:
an input terminal; and
an output terminal, wherein the output terminal is grounded.

14. A programmable capacitor array comprising:
a first switchable capacitive element, comprising:
a first field effect transistor (FET) device stack that is operable in an open state and in a closed state, the first FET device stack comprising a first plurality of FET devices coupled in series to form the first FET device stack;
a first capacitor coupled to a first end of the first FET device stack and coupled in series with the first FET device stack; and
a second capacitor coupled to a second end of the first FET device stack opposite the first end of the first FET device stack, and coupled in series with the first FET device stack; and
a third capacitor coupled in series with the first capacitor so that the first capacitor and the third capacitor provide a series capacitance;
wherein the second capacitor has an other capacitance, wherein the other capacitance of the second capacitor is higher than the series capacitance of the first capacitor and the third capacitor,
a second switchable capacitive element.

15. The programmable capacitor array of claim 14 wherein the first switchable capacitive element and the second switchable capacitive element are coupled in parallel and wherein the second switchable capacitive element comprises:
a second FET device stack that is operable in the open state and in the closed state, the second FET device stack comprising a second plurality of FET devices coupled in series to form the second FET device stack;
a fourth capacitor coupled to a third end of the second FET device stack and being coupled in series with the second FET device stack; and
a fifth capacitor coupled to a fourth end of the second FET device stack opposite the third end of the second FET device stack, and coupled in series with the second FET device stack.

16. The programmable capacitor array of claim 15 further comprising a control circuit wherein:
each of the first plurality of FET devices and each of the second plurality of FET devices comprises a drain contact, a source contact, and a gate contact; and the control circuit is configured to:
  bias the gate contact of each of the first plurality of FET devices at a first voltage such that the first FET device stack operates in the closed state;
  bias the gate contact of each of the second plurality of FET devices at the first voltage such that the second FET device stack operates in the closed state, wherein the first voltage is positive relative to a reference voltage;
  bias the gate contact of each of the first plurality of FET devices at a second voltage and bias the drain contact and the source contact of each of the first plurality of FET devices at the first voltage, such that the first FET device stack operates in the open state; and
  bias the gate contact of each of the second plurality of FET devices at the second voltage and bias the drain contact and the source contact of each of the second plurality of FET devices at the first voltage, such that the second FET device stack operates in the open state, wherein the second voltage is lower than the first voltage and is substantially non-negative relative to the reference voltage.

17. The programmable capacitor array of claim 15, wherein a control circuit is configured to receive a control input that is indicative of a first selected state and a second selected state, wherein the first selected state is any one of either the closed state of the first FET device stack and the open state of the first FET device stack, and the second selected state is any one of either the closed state of the second FET device stack and the open state of the second FET device stack, the control circuit being configured to:
  bias the gate contact of each of the first plurality of FET devices at a first voltage in response to the control input being received as indicative of the first selected state being the closed state of the first FET device stack;
  bias the gate contact of each of the second plurality of FET devices at the first voltage in response to the control input being received as indicative of the second selected state being the closed state of the second FET device stack;
  bias the gate contact of each of the first plurality of FET devices at a second voltage and bias the drain contact and the source contact of each of the first plurality of FET devices at the first voltage in response to the control input being received as indicative of the first selected state being the open state of the first FET device stack; and
  bias the gate contact of each of the second plurality of FET devices at the second voltage and bias the drain contact and the source contact of each of the second plurality of FET devices at the first voltage in response to the control input being received as indicative of the first selected state being the open state of the second FET device stack.

18. The programmable capacitor array of claim 15 wherein the first switchable capacitive element further comprises:
  a first input terminal;
  a first output terminal;
  the first capacitor and the third capacitor being coupled in series between the first input terminal and the first end of the first FET device stack; and
  the second capacitor being coupled in series between the first output terminal and the second end of the first FET device stack.

19. The programmable capacitor array of claim 18 wherein the second switchable capacitive element further comprises:
  a second input terminal;
  a second output terminal;
  the fourth capacitor being coupled in series between the second input terminal and the third end of the second FET device stack; and
  the fifth capacitor being coupled in series between the second output terminal and the fourth end of the second FET device stack.

20. The programmable capacitor array of claim 19 wherein:
  the first input terminal is coupled to an upstream radio frequency (RF) circuit and a downstream RF circuit and the first output terminal is grounded such that the first switchable capacitive element is coupled in shunt between the upstream RF circuit and the downstream RF circuit; and
  the second input terminal is coupled to the upstream RF circuit and the downstream RF circuit and the second output terminal is grounded such that the second switchable capacitive element is coupled in shunt between the upstream RF circuit and the downstream RF circuit.

* * * * *